United States Patent
Kobayashi

(10) Patent No.: US 10,381,222 B2
(45) Date of Patent: Aug. 13, 2019

(54) SUBSTRATE TREATMENT METHOD, COMPUTER STORAGE MEDIUM AND SUBSTRATE TREATMENT SYSTEM

(71) Applicant: Tokyo Electron Limited, Tokyo (JP)

(72) Inventor: Shinji Kobayashi, Koshi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/033,537

(22) Filed: Jul. 12, 2018

(65) Prior Publication Data
US 2019/0043722 A1 Feb. 7, 2019

(30) Foreign Application Priority Data
Aug. 3, 2017 (JP) .................................. 2017-150354

(51) Int. Cl.
*H01L 21/66* (2006.01)
*H01L 21/033* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 22/20* (2013.01)

(58) Field of Classification Search
None
See application file for complete search history.

(56) References Cited

U.S. PATENT DOCUMENTS 7,508,976 B1* 3/2009 Yang .................. G03F 7/70633
372/50.11
8,056,022 B2* 11/2011 Robles ................ G06F 17/5081
378/35

(Continued)

FOREIGN PATENT DOCUMENTS

| JP | 2007-311690 A | 11/2007 |
| JP | 2013-535819 A | 9/2013 |
| WO | 2012/010458 A1 | 1/2012 |

OTHER PUBLICATIONS

Kobayashi et al., "Pattern uniformity control in integrated structures" Tokyo Electron Limited. SPIE Advanced Lithography. Presentation given Mar. 2, 2017.

(Continued)

*Primary Examiner* — David E Graybill
(74) *Attorney, Agent, or Firm* — Posz Law Group, PLC

(57) ABSTRACT

A substrate treatment method of performing a plurality of predetermined treatments on a substrate to form a plurality of patterns stacked on the substrate, the substrate treatment method includes: a calculation step of calculating, about patterns in two layers stacked on the substrate, a mutual pattern displacement amount being a displacement amount between the patterns in the two layers, based on an end portion positional displacement of a pattern in an upper layer, an end portion positional displacement of a pattern in a lower layer, and an overlay of the patterns in the two layers; and a correction step of correcting, when the mutual pattern displacement amount exceeds a predetermined threshold, treatment conditions in the predetermined treatments to make the mutual pattern displacement amount fall within the predetermined threshold.

8 Claims, 20 Drawing Sheets

(56) References Cited

U.S. PATENT DOCUMENTS

| | | | | |
|---|---|---|---|---|
| 9,530,199 | B1* | 12/2016 | Weinberg | G06T 7/194 |
| 10,228,320 | B1* | 3/2019 | Levinski | G01N 21/01 |
| 2005/0205776 | A1* | 9/2005 | Dana | G03F 7/70625 |
| | | | | 250/306 |
| 2005/0219484 | A1* | 10/2005 | Chiang | G03F 7/70633 |
| | | | | 355/53 |
| 2007/0279644 | A1* | 12/2007 | Teun Plug | G03F 7/70758 |
| | | | | 356/625 |
| 2009/0303482 | A1* | 12/2009 | Levinski | H01L 21/67294 |
| | | | | 356/400 |
| 2013/0182255 | A1* | 7/2013 | Zhou | G03F 7/70633 |
| | | | | 356/401 |
| 2014/0193974 | A1* | 7/2014 | Lee | H01L 21/76816 |
| | | | | 438/669 |
| 2014/0240703 | A1* | 8/2014 | Lee | G01B 11/14 |
| | | | | 356/401 |
| 2014/0282344 | A1* | 9/2014 | Hsu | G06F 17/5072 |
| | | | | 716/123 |
| 2015/0077733 | A1* | 3/2015 | Huang | G03F 7/70633 |
| | | | | 355/72 |
| 2015/0116717 | A1* | 4/2015 | Manassen | G01N 21/55 |
| | | | | 356/445 |
| 2015/0140685 | A1* | 5/2015 | Watanabe | H01L 21/312 |
| | | | | 438/3 |
| 2015/0170904 | A1* | 6/2015 | Tsen | H01L 21/0274 |
| | | | | 438/14 |
| 2016/0003609 | A1* | 1/2016 | Shchegrov | G03F 7/7065 |
| | | | | 356/625 |
| 2016/0005662 | A1* | 1/2016 | Yieh | H01L 22/20 |
| | | | | 438/14 |
| 2016/0013109 | A1* | 1/2016 | Yun | H01J 37/222 |
| | | | | 438/5 |
| 2016/0062250 | A1* | 3/2016 | Hung | G03F 7/70633 |
| | | | | 355/67 |
| 2016/0124323 | A1* | 5/2016 | Chung | G03F 1/70 |
| | | | | 438/7 |
| 2016/0253450 | A1* | 9/2016 | Kandel | H01L 22/30 |
| | | | | 356/401 |
| 2016/0313658 | A1* | 10/2016 | Marciano | G03F 9/7003 |
| 2017/0052452 | A1* | 2/2017 | Mailfert | G03F 1/36 |
| 2017/0138725 | A1* | 5/2017 | Kawada | G01B 15/00 |
| 2017/0192050 | A1* | 7/2017 | Lei | G01R 31/275 |
| 2017/0194126 | A1* | 7/2017 | Bhaskar | G03F 7/7065 |
| 2017/0221760 | A1* | 8/2017 | Smith | H01L 21/76897 |
| 2017/0269481 | A1* | 9/2017 | Borodovsky | H01L 21/0277 |
| 2017/0329232 | A1* | 11/2017 | Goorden | G02B 27/0994 |
| 2017/0352585 | A1* | 12/2017 | Burns | H01L 21/76816 |
| 2017/0363950 | A1* | 12/2017 | Sriraman | G03F 1/36 |
| 2018/0090296 | A1* | 3/2018 | Neil | H01J 37/147 |
| 2018/0120807 | A1* | 5/2018 | Czerkas | G05B 19/402 |
| 2018/0164698 | A1* | 6/2018 | Yang | G03F 7/70633 |
| 2018/0166330 | A1* | 6/2018 | Chu | H01L 21/76816 |
| 2018/0166379 | A1* | 6/2018 | Yeo | H01L 23/5226 |
| 2018/0188663 | A1* | 7/2018 | Levinski | G03F 7/70625 |
| 2018/0252996 | A1* | 9/2018 | Wan | G03F 1/36 |
| 2018/0267410 | A1* | 9/2018 | Hempenius | G03F 7/7085 |
| 2018/0284624 | A1* | 10/2018 | Ausschnitt | G03F 7/70641 |
| 2018/0323100 | A1* | 11/2018 | Nyhus | H01L 21/0337 |
| 2018/0364036 | A1* | 12/2018 | Jak | G01B 11/30 |
| 2018/0372652 | A1* | 12/2018 | Immer | G01N 21/31 |
| 2019/0043722 | A1* | 2/2019 | Kobayashi | H01L 21/0338 |
| 2019/0049858 | A1* | 2/2019 | Gurevich | G03F 7/70633 |

OTHER PUBLICATIONS

SPIE schedule for Mar. 2, 2017. Conference 10147 for Optical Microlithography.

Kobayashi et al., "Pattern uniformity control in integrated structures" Tokyo Electron Limited. SPIE Advanced Lithography. Mar. 27, 2017.

Kobayashi et al., "Pattern uniformity control in integrated structures" Tokyo Electron Limited. NGL workshop. Presentation given Jul. 18, 2017.

* cited by examiner $$IPFE_i = \frac{L_T}{2} - \min(W_j)$$

$$IPFE_i = 0$$

$$IPFE_i = \frac{L_T}{2}$$

$$IPFE_i > \frac{L_T}{2}$$

$$IPFE_i = \frac{S_T}{2} - \min(W_j)$$

$$IPFE_i = \frac{S_T}{2} - \min(W_j)$$

$$IPFE_i = \frac{L_T - D_T}{2} - \min(W_j)$$

$$IPFE_i = \frac{L_T - D_T}{2} - \min(W_j)$$

$$IPFE_i = \frac{S_T - D_T}{2} - \min(W_j)$$

$$IPFE_i = \frac{S_T - D_T}{2} - \min(W_j)$$

| STEP | | TREATMENT 1 | TREATMENT 2 | TREATMENT 3 | MEASUREMENT 1 | MEASUREMENT 2 |
|---|---|---|---|---|---|---|
| S1 | TiN deposition | FILM FORMATION | | | FILM THICKNESS | |
| S2 | SOC coat | COATING | HEATING | | FILM THICKNESS | |
| S3 | SOG coat | COATING | HEATING | | FILM THICKNESS | |
| S4 | Resist coat | COATING | HEATING (PAB) | | FILM THICKNESS | |
| S5 | Line litho | EXPOSURE | HEATING (PEB) | DEVELOPMENT | CD | |
| S6 | SOG open | ETCHING | | | CD | |
| S7 | SOC open | ETCHING | | | CD | |
| S8 | SOC slim | ETCHING | | | CD | |
| S9 | SOG removal | ETCHING | | | CD | |
| S10 | Spacer depo. | FILM FORMATION | | | CD | |
| S11 | Etch back | ETCHING | | | CD | |
| S12 | Mandrel removal | ETCHING | | | CD | |
| S13 | SOC coat | COATING | HEATING | | FILM THICKNESS | LEVEL DIFFERENCE |
| S14 | SOG coat | COATING | HEATING | | FILM THICKNESS | |
| S15 | Resist coat | COATING | HEATING (PAB) | | FILM THICKNESS | |
| S16 | Block litho | EXPOSURE | HEATING (PEB) | DEVELOPMENT | CD | OVL |
| S17 | SOG open | ETCHING | | | CD | |
| S18 | SOC open | ETCHING | | | CD | |
| S19 | SOG removal | ETCHING | | | CD | |
| S20 | TiN open | ETCHING | | | CD | |
| S21 | SiO2 open | ETCHING | | | CD | |

SUBSTRATE TREATMENT METHOD, COMPUTER STORAGE MEDIUM AND SUBSTRATE TREATMENT SYSTEM

CROSS REFERENCE TO RELATED APPLICATIONS

This application is based upon and claims the benefit of priority of the prior Japanese Patent Application No. 2017-150354, filed in Japan on Aug. 3, 2017, the entire contents of which are incorporated herein by reference.

STATEMENT DESIGNATING GRACE PERIOD INVENTOR DISCLOSURE

Part of the present invention was disclosed in the following: Kobayashi et al., "Pattern Uniformity Control In Integrated Structures", SPIE Advanced Lithography, presented on Mar. 2, 2017; Kobayashi et al., "Pattern Uniformity Control In Integrated Structures", SPIE Advanced Lithography", Proceedings of the SPIE, published on Mar. 27, 2017; Kobayashi, et al., "Pattern Uniformity Control in Integrated Structures", presented on Jul. 18-19, 2017. These papers are grace period inventor-originated disclosures disclosed within one year before the effective filing date hereof. The disclosure: (1) was made one year or less before the effective filing date of the claimed invention; (2) names the inventor or a joint inventor as an author; and (3) was made by the inventor or a joint inventor, or by another who obtained the subject matter directly or indirectly from the inventor or a joint inventor. The additional non-inventor authors are Soichiro Okada (editor, who assisted in summarizing the results of the invention); Satoru Shimura, Kathleen Nafus, Carlos Fonseca, Serge Biesemans and Masashi Enomoto (editors, who advised on summarizing the results of the invention), who obtained the disclosure which originated from the present inventor(s).

BACKGROUND

1. Field of the Invention

This disclosure relates to a substrate treatment method, a computer storage medium, and a substrate treatment system.

2. Description of the Related Art

In a manufacturing process of a semiconductor device of a multilayer wiring structure, for example, a film forming treatment of forming a film to be treated on a semiconductor wafer (hereinafter, referred to as a "wafer"), photolithography processing of forming a resist pattern on the film to be treated, an etching treatment for the film to be treated using the resist pattern as a mask, a removing treatment of the resist film and so on are performed to form a predetermined pattern in the film to be treated on the wafer. The process of forming a predetermined pattern in a predetermined layer is repeatedly performed a plurality of times to manufacture the semiconductor device of the multilayer wiring structure.

In the semiconductor device, the predetermined pattern needs to be formed with an appropriate dimension (for example, a critical dimension) and at an appropriate position (for example, an overlay). In particular, in recent years, with higher integration of the semiconductor device, the pattern is miniaturized, so that even little variation in critical dimension of the pattern and variation in overlay within the wafer causes defects of the pattern. Therefore, the accuracy required of the pattern is severe.

Hence, for example, Japanese Laid-open Patent Publication No. 2007-311690 proposes that photolithography processing is performed to from a resist pattern on a wafer and the dimension of the critical dimension of the resist pattern or the like is measured and then the heating temperature of, for example, a PEB treatment is corrected based on the dimension measurement result to make the dimension of the resist pattern appropriate.

Further, for example, Japanese Translation of PCT International Application Publication No. 2013-535819 proposes that in order to bring an overlay error between a pattern which has been already formed on the wafer (a pattern in a lower layer) and a pattern which is exposed thereafter (a pattern in an upper layer) into a predetermined range, the overlay error is measured in exposure processing, and the processing condition of the exposure processing is set based on the error.

However, the method disclosed in Japanese Laid-open Patent Publication No. 2007-311690 can make the dimension of the pattern in a single layer appropriate, but does not take the correlation (mutual position) between stacked patterns into consideration. On the other hand, the method disclosed in Japanese Translation of PCT International Application Publication No. 2013-535819 can make the overlay between layers appropriate, but does not take appropriate formation of the dimension of the pattern in a single layer into consideration.

As described above, in the semiconductor device of the multilayer wiring structure, the conventional methods separately measure the dimension of the pattern in a single layer and the overlay and cannot properly determine the quality of a plurality of stacked patterns. In this case, even if the treatment condition of each treatment is set or corrected using the determination result, the pattern cannot be always sufficiently made appropriate, and there is a room for improvement in making the pattern appropriate.

The technique according to this disclosure has been made in consideration of above circumstances, and makes a plurality of patterns appropriate in forming the plurality of patterns stacked on a substrate.

An aspect of the above disclosure is a substrate treatment method of performing a plurality of predetermined treatments on a substrate to form a plurality of patterns stacked on the substrate, the substrate treatment method including: a calculation step of calculating, about patterns in two layers stacked on the substrate, a mutual pattern displacement amount being a displacement amount between the patterns in the two layers, based on an end portion positional displacement of a pattern in an upper layer, an end portion positional displacement of a pattern in a lower layer, and an overlay of the patterns in the two layers; and a correction step of correcting, when the mutual pattern displacement amount exceeds a predetermined threshold, treatment conditions in the predetermined treatments to make the mutual pattern displacement amount fall within the predetermined threshold.

In this disclosure, the end portion positional displacement of the pattern is a difference between the ideal shape and the actual shape of the pattern. Concretely, the end portion positional displacement indicates the state where the position of the end portion of the pattern is displaced from the ideal position due to the size of the pattern, roughness, displacement of barycenter or the like, or its length. In short, the end portion positional displacement can be a value of variation of the pattern in a single layer. Hereinafter, the end portion positional displacement of the pattern is called an EPE (Edge Placement Error). Further, the mutual pattern displacement amount is an index newly defined by the disclosers and is hereinafter called an IPFE (Interactive Pattern Fidelity Error).

According to one aspect of this disclosure, the IPFE is calculated based on the EPE of the pattern in the upper layer, the EPE of the pattern in the lower layer, and the overlay of the patterns in the two upper and lower layers. Though only either the dimension (EPE) of the pattern in each layer or the overlay of the two layers has been conventionally taken into consideration as described above, one aspect of this disclosure uses the IPFE taking both of them into consideration, thereby enabling appropriate determination of the quality of the pattern.

In addition, the treatment conditions in the predetermined treatments are corrected using the IPFE, so that the EPEs and the overlay of the stacked patterns can be made to fall within allowable ranges to make the patterns appropriate by treating the substrate under the corrected treatment conditions.

One aspect of this disclosure according to another viewpoint is a computer-readable storage medium storing a program running on a computer of a control unit configured to control a substrate treatment system so as to cause the substrate treatment system to execute the substrate treatment method.

One aspect of this disclosure according to still another viewpoint is a substrate treatment system configured to form a plurality of patterns stacked on a substrate, the substrate treatment system including: a plurality of treatment apparatuses configured to perform predetermined treatments on the substrate; and a control unit configured to set treatment conditions of the predetermined treatments, wherein the control unit is configured to perform, through control of the control unit: a calculation step of calculating, about patterns in two layers stacked on the substrate, a mutual pattern displacement amount being a displacement amount between the patterns in the two layers, based on an end portion positional displacement of a pattern in an upper layer, an end portion positional displacement of a pattern in a lower layer, and an overlay of the patterns in the two layers; and a correction step of correcting, when the mutual pattern displacement amount exceeds a predetermined threshold, treatment conditions in treatments on the substrate to make the mutual pattern displacement amount fall within the predetermined threshold.

According to one aspect of this disclosure, in forming a plurality of patterns stacked on a substrate, an IPFE is calculated to correct the treatment conditions in the predetermined treatments, thereby making it possible to make a plurality of patterns appropriate. As a result of this, the yields of products can be improved.

BRIEF DESCRIPTION OF THE DRAWINGS

FIG. 18 is an explanatory view illustrating the states on the wafer at steps of a manufacturing process of a semiconductor device.

FIG. 19 is a list of treatment items and measurement items at the steps of the manufacturing process of the semiconductor device.

DETAILED DESCRIPTION

Figure 1:
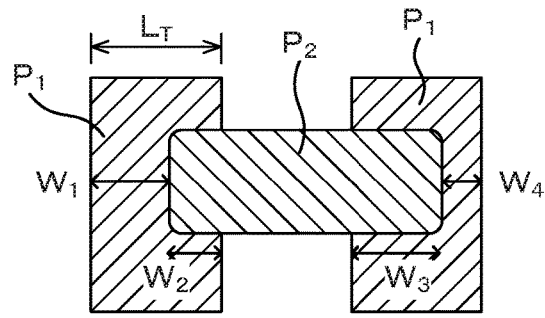
FIG. 1 is an explanatory view representing the definition of an $IPFE_i$.

Hereinafter, an embodiment of the present invention will be described referring to the drawings. Note that in this specification and the drawings, components having substantially the same functional configurations are denoted by the same reference numerals to omit duplicated description.

<Quality Determination for Patterns by the IPFE>

The present inventors have defined an IPFE (Interactive Pattern Fidelity Error) as an index for determining the quality of a plurality of stacked patterns for a semiconductor device of a multilayer wiring structure. The IPFE is an index defined based on an EPE (Edge Placement Error) of a pattern in an upper layer, an EPE of a pattern in a lower layer, and an overlay of the patterns in the two upper and lower layers. The EPE represents a state where the position of an end portion of the pattern is displaced from the ideal position as described above or its length, and is a value of variation of the pattern in a single layer. In this embodiment, the EPE is calculated based on variation in critical dimension (CD) of the pattern and variation in barycentric position. The variation in critical dimension of the pattern represents whether the dimension of the pattern is correct. Besides, the variation in barycentric position represents whether the pattern is located at a correct position (barycenter), and the barycentric position includes a barycentric position in an arbitrary direction. The barycentric position includes, for example, in addition to the barycentric position in the horizontal direction (for example, an X-axis direction), the barycentric position in the vertical direction (for example, a Y-axis direction), and the barycentric position in another direction in which a part likely to be crucial, a so-called Hot Spot is at an oblique angle (for example, 45 degrees). The EPE can be calculated based on any barycentric position.

(Description of an $IPFE_i$)

Prior to concrete description of the IPFE, an $IPFE_i$ at an individual element level will be described. FIG. 1 is an explanatory view representing the definition of the $IPFE_i$. In FIG. 1, $P_1$ is a pattern in a lower layer and is, for example, a pattern of a line and space. $P_2$ is a pattern in an upper layer and is, for example, a pattern of a pillar or block. Note that the example in FIG. 1 illustrates a case where the upper layer pattern $P_2$ is arranged over a pair of lower layer patterns $P_1$, $P_1$ (hereinafter, referred to as a bridge type).

The $IPFE_i$ of the bridge type is defined by following Expression (2)

$$IPFE_i = \frac{L_T}{2} - \min(W_j) \quad (2)$$

where $L_T$: a target critical dimension of the lower layer pattern $P_1$, and $W_j$: a distance between an end portion of the lower layer pattern $P_1$ and an end portion of the upper layer pattern $P_2$.

Figure 2A:
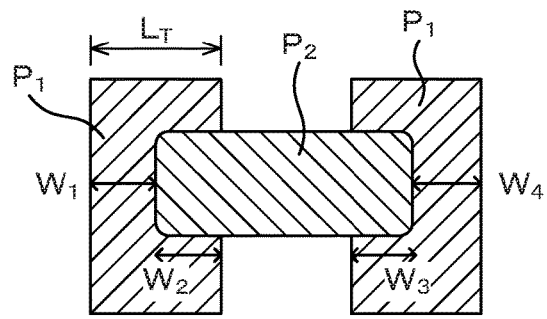
FIG. 2A is an explanatory view illustrating a concrete example of the $IPFE_i$ of a bridge type and a case where patterns are in ideal states.
Figure 2B:
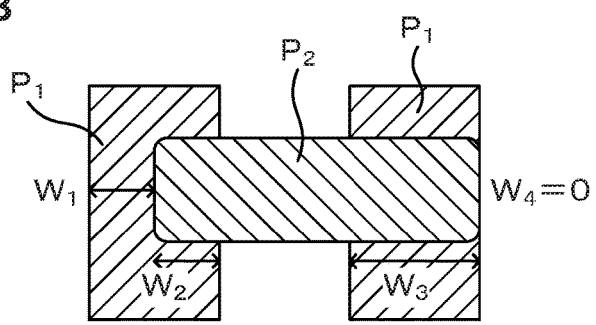
FIG. 2B is an explanatory view illustrating a concrete example of the $IPFE_i$ of the bridge type and a case where the patterns are at the limit of an allowable range.
Figure 2C:
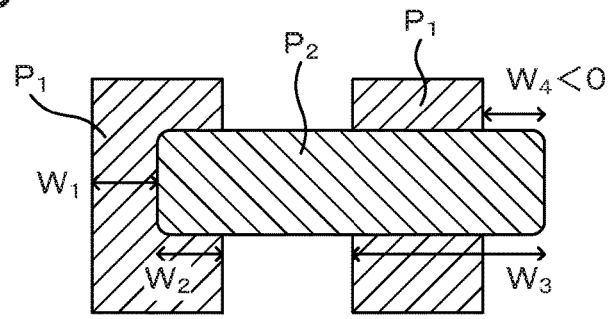
FIG. 2C is an explanatory view illustrating a concrete example of the $IPFE_i$ of the bridge type and a case where the patterns are outside the allowable range.

FIG. 2A to FIG. 2C are explanatory views illustrating concrete examples of the $IPFE_i$ of the bridge type. FIG. 2A illustrates a case where the patterns $P_1$, $P_2$ are in ideal states. In other words, the upper layer pattern $P_2$ is arranged at the center of the pair of the lower layer patterns $P_1$, $P_1$. In this case, all of $W_j$s become $L_T/2$, and $\min(W_j)$ in above Expression (2) also becomes $L_T/2$. Then, the $IPFE_i$ becomes 0 (zero).

FIG. 2B illustrates a case where the patterns $P_1$, $P_2$ are at the limit of an allowable range. In other words, this is a case in which the upper layer pattern $P_2$ is arranged on the pair of the lower layer patterns $P_1$, $P_1$ in a manner to barely protrude therefrom, in which an end portion of one lower layer pattern $P_1$ coincides with an end portion of the upper layer pattern $P_2$. In this case, $W_4$ becomes 0 (zero), and $\min(W_j)$ in above Expression (2) also becomes 0 (zero). Thus, the $IPFE_i$ becomes $L_T/2$. Then, $L_T/2$ becomes a threshold of the $IPFE_i$. In other words, the threshold of the $IPFE_i$ is an allowable positional displacement amount of the upper layer pattern $P_2$ with respect to the lower layer pattern $P_1$.

FIG. 2C illustrates a case where the patterns $P_1$, $P_2$ are outside the allowable range. In other words, this is a case in which the upper layer pattern $P_2$ is arranged to protrude from the pair of the lower layer patterns $P_1$, $P_1$. In this case, $W_4$ becomes minus, and $\min(W_j)$ in above Expression (2) also becomes minus. Thus, the $IPFE_i$ becomes a value larger than $L_T/2$.

The above is the basic concept, and the $IPFE_i$ is applicable to various stack types other than the above-described bridge type.

Figure 3A:
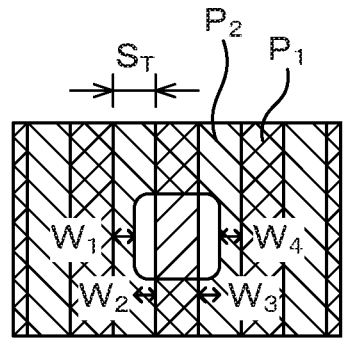
FIG. 3A is an explanatory view illustrating a concrete example of the $IPFE_i$ of a cut type and a state in which a case where a hole of an upper layer pattern is arranged on one lower layer pattern is within an allowable range.
Figure 3B:
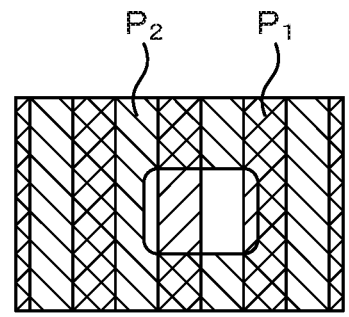
FIG. 3B is an explanatory view illustrating a concrete example of the $IPFE_i$ of the cut type and a state in which a case where the hole of the upper layer pattern is arranged on a pair of the lower layer patterns is outside the allowable range.

FIG. 3A and FIG. 3B are explanatory views illustrating concrete examples of the $IPFE_i$ of a cut type. The cut type is a case in which an upper layer pattern $P_2$ formed with a hole is arranged on one lower layer pattern $P_1$ of a line and space. More specifically, a case where the hole of the upper layer pattern $P_2$ is arranged on one lower layer pattern $P_1$ as illustrated in FIG. 3A is within an allowable range, and a case where the hole of the upper layer pattern $P_2$ is arranged on a pair of the lower layer patterns $P_1$, $P_1$ as illustrated in FIG. 3B is outside the allowable range.

The $IPFE_i$ of the cut type is defined by following Expression (3)

$$IPFE_i = \frac{S_T}{2} - \min(W_j) \quad (3)$$

where $S_T$: a target interval between the lower layer patterns $P_1$, $P_1$ (a target interval of a space), and $W_j$: a distance between an end portion of the lower layer pattern $P_1$ and an end portion of the hole of the upper layer pattern $P_2$.

The threshold of the allowable range of the $IPFE_i$ becomes $S_T/2$. The $IPFE_i$ becomes smaller than $S_T/2$ in the example illustrated in FIG. 3A, and the $IPFE_i$ becomes larger than $S_T/2$ in the example illustrated in FIG. 3B.

Figure 4A:
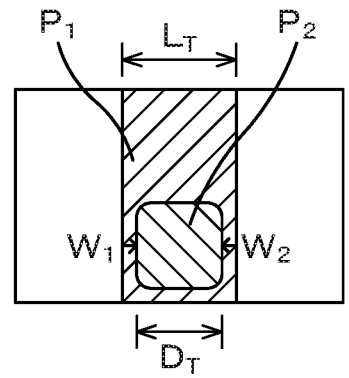
FIG. 4A is an explanatory view illustrating a concrete example of the $IPFE_i$ of a via type and a state in which a case where a hole of an upper layer pattern is arranged inside one lower layer pattern is within an allowable range.
Figure 4B:
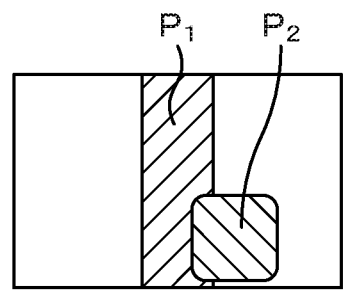
FIG. 4B is an explanatory view illustrating a concrete example of the $IPFE_i$ of the via type and a state in which a case where the upper layer pattern is arranged to protrude from the lower layer pattern is outside the allowable range.

FIG. 4A and FIG. 4B are explanatory views illustrating concrete examples of the $IPFE_i$ of a via type. The via type is a case in which an upper layer pattern $P_2$ in a via shape is arranged on one lower layer pattern $P_1$ of a line and space. More specifically, a case where the hole of the upper layer pattern $P_2$ is arranged inside one lower layer pattern $P_1$ as illustrated in FIG. 4A is within an allowable range, and a case where the upper layer pattern $P_2$ is arranged to protrude from the lower layer pattern $P_1$ as illustrated in FIG. 4B is outside the allowable range. Note that in FIG. 4A and FIG. 4B, the upper layer pattern $P_2$ is illustrated to be a substantially rectangular shape but may take various shapes, for example, a circular shape and the like.

The IPFE$_i$ of the via type is defined by following Expression (4)

$$IPFE_i = \frac{L_T - D_T}{2} - \min(W_j) \quad (4)$$

where $L_T$: a target critical dimension of the lower layer pattern P$_1$, D$_T$: a target diameter of the upper layer pattern P$_2$, and W$_j$: a distance between an end portion of the lower layer pattern P$_1$ and an end portion of the upper layer pattern P$_2$.

The threshold of the allowable range of the IPFE$_i$ becomes $(L_T-D_T)/2$. In the case illustrated in FIG. 4A, the IPFE$_i$ becomes smaller than $(L_T-D_T)/2$. In the case illustrated in FIG. 4B, the IPFE$_i$ becomes larger than $(L_T-D_T)/2$.

Figure 5A:
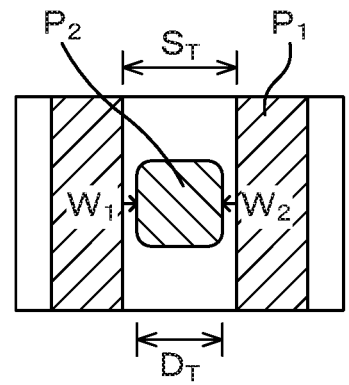
FIG. 5A is an explanatory view illustrating a concrete example of the $IPFE_i$ of an island type and a state in which a case where the entire upper layer pattern is arranged between a pair of lower layer patterns is within an allowable range.
Figure 5B:
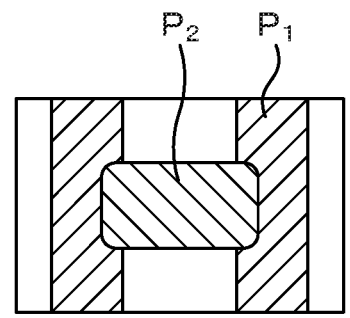
FIG. 5B is an explanatory view illustrating a concrete example of the $IPFE_i$ of the island type and a state in which a case where the upper layer pattern is arranged extending over the lower layer patterns is outside the allowable range.

FIG. 5A and FIG. 5B are explanatory views illustrating concrete examples of the IPFE$_i$ of an island type. The island type is a case in which an upper layer pattern P$_2$ of a pillar or block pattern is arranged on a space between a pair of lower layer patterns P$_1$, P$_1$ of a line and space. More specifically, a case where the entire upper layer pattern P$_2$ is arranged between the pair of lower layer patterns P$_1$, P$_1$ as illustrated in FIG. 5A is within an allowable range, and a case where the upper layer pattern P$_2$ is arranged extending over the lower layer patterns P$_1$ as illustrated in FIG. 5B is outside the allowable range.

The IPFE$_i$ of the island type is defined by following Expression (5)

$$IPFE_i = \frac{S_T - D_T}{2} - \min(W_j) \quad (5)$$

where $S_T$: a target interval between the lower layer patterns P$_1$, P$_1$ (a target interval of a space), D$_T$: a target diameter of the upper layer pattern P$_2$, and W$_j$: a distance between an end portion of the lower layer pattern P$_1$ and an end portion of the upper layer pattern P$_2$.

The threshold of the allowable range of the IPFE$_i$ becomes $(S_T-D_T)/2$. In the example illustrated in FIG. 5A, the IPFE$_i$ becomes smaller than $(S_T-D_T)/2$, and in the example illustrated in FIG. 5B, the IPFE$_i$ becomes larger than $(S_T-D_T)/2$.

As described above, the IPFE$_i$ is applicable to various stack types. Further, the IPFE$_i$ is applicable not limited to the individual stack types as describe above but also to complicated ones made by combining the stack types on the basis of the same concept.

(Description of an IPFE)

The IPFE is an index of quality determination for a plurality of patterns in a semiconductor device in consideration of a plurality of IPFE$_i$s at the element level. More specifically, the IPFE is a maximum value of the plurality of IPFE$_i$s. Note that the semiconductor devices being objects of the IPFE may be on a wafer basis or on a die (chip) basis.

Figure 6:
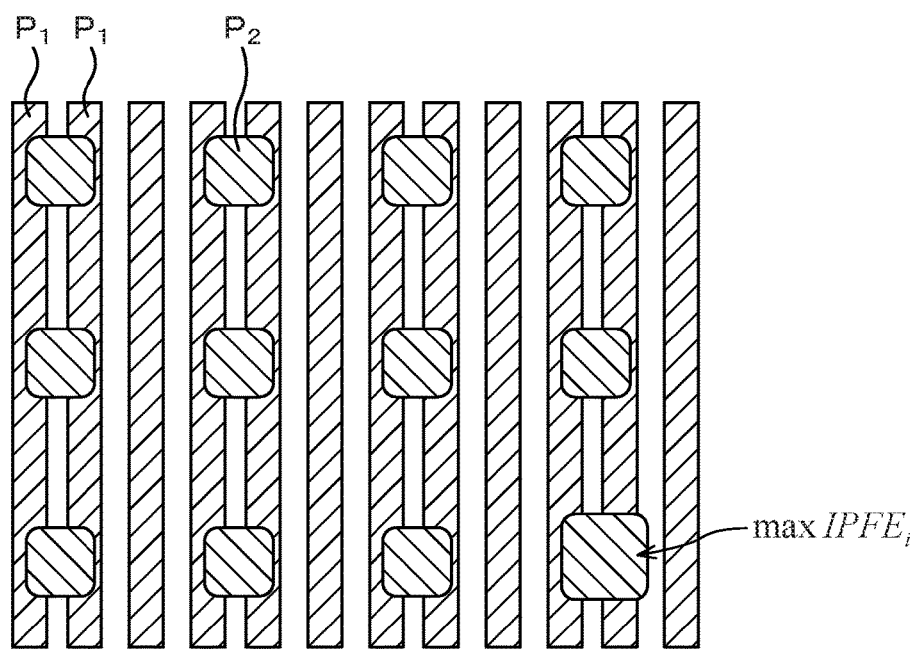
FIG. 6 is an explanatory view illustrating a concrete example of an IPFE of the bridge type.

FIG. 6 is an explanatory view illustrating a concrete example of the IPFE of the bridge type. In the case where a plurality of IPFE$_i$s exist as illustrated in FIG. 6, even if an average value of them is within the threshold, the patterns in the semiconductor device are not always good. If there is only one pattern having an IPFE$_i$ outside the allowable range, the semiconductor device becomes defective. In other words, the maximum value of the plurality of IPFE$_i$s is within the threshold, the semiconductor device is good.

Accordingly, the IPFE is the maximum value of the plurality of IPFE$_i$s as described above.

The IPFE is the maximum value of the plurality of IPFE$_i$s as described above, and is defined also based on the overlay of the patterns in the two upper and lower layers, the EPE of the lower layer pattern, and the EPE of the upper layer pattern as described above. The EPE is a value of variation of pattern in each layer, calculated based on variation in critical dimension of the pattern and variation in barycentric position. Besides, the variation in barycentric position is caused from periodic dimensional fluctuation called Pitch Waling.

More specifically, the IPFE is a function of the overlay of the patterns in the two upper and lower layers, the EPE of the pattern in the lower layer, and the EPE of the pattern in the upper layer, and its threshold is expressed by following Expression (6). In Expression (6), the first term of the right side is the overlay of the patterns in the two upper and lower layers, the second term of the right side is the EPE of the pattern in the lower layer, and the third term of the right side is the EPE of the pattern in the upper layer. Note that the IPFE is not a value representing the standard deviation of variation, but represents the length obtained by digitizing the stack state. Expression (6) has a relation of an arithmetic sum and does not seem to be mathematically correct, but the IPFE is not the standard deviation as expressed as an IPFE$_{TH}$ in Expression (6)

$$IPFE_{TH} = (OVL + n\sigma_{OVL}) + \left(\frac{\Delta L + n\sigma_L}{2}\right) + \left(\frac{\Delta D + n\sigma_D}{2}\right) \quad (6)$$

where OVL: a value of the overlay, $\Delta L$: a difference between a target value and an average value of the critical dimension of the lower layer pattern, $\Delta D$: a difference between a target value and an average value of the critical dimension of the upper layer pattern, n: a positive coefficient (for example, 3 or 4.5), $\sigma_{OVL}$: a standard deviation of the overlay, $\sigma_L$: a standard deviation of the critical dimension of the lower layer pattern, and $\sigma_D$: a standard deviation of the critical dimension of the upper layer pattern.

Then, organizing Expression (6), following Expression (1) is derived.

$$IPFE = \left(OVL + \frac{\Delta L}{2} + \frac{\Delta D}{2}\right) + n\left(\sigma_{OVL} + \frac{\sigma L}{2} + \frac{\sigma D}{2}\right) \quad (1)$$

(Description of an IPFE Distribution)

Next, a distribution of the IPFE (a probability density distribution) will be described. An IPFE distribution will be described here using the bridge pattern illustrated in FIG. 1 as an example.

For example, in a stack pattern of the bridge type, the stack pattern of the lower layer pattern and the upper layer pattern is composed of the following eight variations (parameters). The eight parameters are input values when calculating the distribution of the IPFE.

OVL: a value of the overlay $\Delta L$: a difference between a target value and an average value of the critical dimension of the lower layer pattern $\Delta D$: a difference between a target value and an average value of the critical dimension of the upper layer pattern $\Delta S$: a difference between a target value and an average value of the interval between the lower layer patterns (an interval of a space)

$\sigma_{OVL}$: a standard deviation of the overlay $\sigma_L$: a standard deviation of the critical dimension of the lower layer pattern $\sigma_D$: a standard deviation of the critical dimension of the upper layer pattern.

$\sigma_{LPR}$: a standard deviation of a meandering state LPR (Line Placement Error) of the lower layer pattern.

The distances $W_1$ to $W_4$ between the end portions of the lower layer patterns and the end portions of the upper layer pattern are calculated from the eight parameters, and $IPFE_{i1}$ to $IPFE_{i4}$ are calculated respectively from following Expressions (7) to (10). Then, the $IPFE_i$ for the smallest $W_j$ becomes a representative value of the stack pattern as expressed in above Expression (2). Note that in the following, a state where one $W_j$ is smaller than the other $W_j$ is called "employment" of the one $W_j$ (Win), whereas a state where one $W_j$ is larger than the other $W_j$ is called "discard" of the one $W_j$ (Lose) in some cases.

$$IPFE_{i1} = \frac{L_T}{2} - W_1 \quad (7)$$

$$IPFE_{i2} = \frac{L_T}{2} - W_2 \quad (8)$$

$$IPFE_{i3} = \frac{L_T}{2} - W_3 \quad (9)$$

$$IPFE_{i4} = \frac{L_T}{2} - W_4 \quad (10)$$

The eight parameters OVL, $\Delta L$, $\Delta D$, $\Delta S$, $\sigma_{OVL}$, $\sigma_L$, $\sigma_D$, $\sigma_{LPR}$, and $W_1$ to $W_4$, and $IPFE_{i1}$ to $IPFE_{i4}$ obtained from the plurality of stack patterns are all normal distributions, but the IPFE distribution calculated form them becomes no longer a normal distribution.

Figure 7:
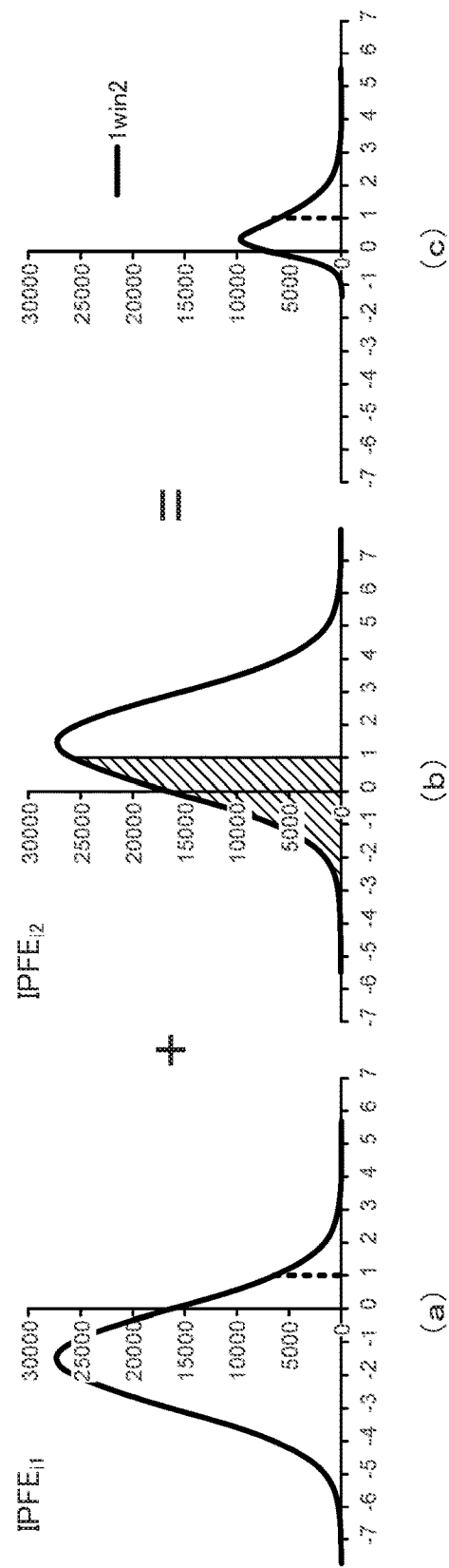
FIG. 7 is an explanatory view illustrating IPFE distributions for two $IPFE_i$s.

For example, a case where $W_1$ of $W_1$ to $W_4$ is smallest will be described. First of all, for easy description, only the distributions for $W_1$ and $W_2$ will be described based on FIG. 7. In each of graphs in FIG. 7, the horizontal axis indicates the $IPFE_i$ and the vertical axis indicates the probability density. FIG. 7(a) illustrates the probability density distribution of the $IPFE_{i1}$ and FIG. 7(b) illustrates the probability density distribution of the $IPFE_{i2}$, which are normal distributions. On the other hand, FIG. 7(c) is a distribution obtained by synthesizing (a) and (b) that is a distribution of the IPFE (probability density distribution) remaining after $W_1$ ($IPFE_{i1}$) is employed and $W_2$ ($IPFE_{i2}$) is discarded, and does not become a normal distribution.

In the case where the $IPFE_{i1}$ is 1 as indicated by a dotted line in FIG. 7(a), the $IPFE_{i2}$ needs to be smaller than 1, namely, needs to be in an shaded area illustrated in FIG. 7(b) in order to employ the $IPFE_{i1}$ and discard the $IPFE_{i2}$. The magnitude of the dotted line in the graph of the $IPFE_{i1}$ in FIG. 7(a) is a probability density function (PDF). The area of the shaded area in the graph of the $IPFE_{i2}$ in FIG. 7(b) can be expressed by a cumulative distribution function (CDF). Then, an IPFE distribution function F(x) in FIG. 7(c) is a function of multiplication of a probability density function $\phi(x)$ of the $IPFE_{i1}$ and a cumulative distribution function $\Phi(x)$ of the $IPFE_{i2}$.

However, $W_1$ ($IPFE_{i1}$) and $W_2$ ($IPFE_{i2}$) are not in an independent relation but in a dependent relation of influencing each other. Therefore, the above-described cumulative distribution function $\Phi(x)$ needs to be corrected to $\Psi_{i2}(x)$ depending on both $W_1$ ($IPFE_{i1}$) and $W_2$ ($IPFE_{i2}$). Then, the IPFE distribution function F(x) is calculated by multiplying a probability density function $\phi_1(x)$ and a cumulative distribution function $\Psi_{12}(x)$.

Though the case where $W_1$ ($IPFE_{i1}$) is employed and $W_2$ ($IPFE_{i2}$) is discarded has been described in the above example, $W_1$ ($IPFE_{i1}$) needs to be employed for other $W_3$ ($IPFE_{i3}$) and $W_4$ ($IPFE_{i4}$). Then, the IPFE distribution function F(x) is calculated by multiplying the probability density function $\phi_1(x)$ and the cumulative distribution functions $\Psi_{12}(x)$, $\Psi_{13}(x)$, $\Psi_{14}(x)$. Generalizing the IPFE distribution function F(x) in consideration of each of the case where $W_2$ ($IPFE_{i2}$) is employed, the case where $W_3$ ($IPFE_{i3}$) is employed, and the case where $W_4$ ($IPFE_{i4}$) is employed, following Expression (11) is derived. More specifically, the IPFE distribution function F(x) in Expression (11) becomes a form of 16 functions in total including four probability density functions $\phi$ in total and 12 cumulative distribution functions $\Psi$ in total. Each of the probability density functions $\phi$ and the cumulative distribution functions $\Psi$ is expressed by the above-described eight parameters OVL, $\Delta L$, $\Delta D$, $\Delta S$, $\sigma_{OVL}$, $\sigma_L$, $\sigma_D$, $\sigma_{LPR}$.

$$F(x) = \phi_1 \Psi_{12} \Psi_{13} \Psi_{14} + \phi_2 \Psi_{21} \Psi_{23} \Psi_{24} + \phi_3 \Psi_{31} \Psi_{32} \Psi_{34} + \phi_4 \Psi_{41} \Psi_{42} \Psi_{43} \quad (11)$$

Next, concrete examples of the IPFE distribution calculated by the above IPFE distribution function F(x) will be described based on FIG. 8A to FIG. 8E. FIG. 8A to FIG. 8D are distributions in the cases where $W_1$ ($IPFE_{i1}$), $W_2$ ($IPFE_{i2}$), $W_3$ ($IPFE_{i3}$), $W_4$ ($IPFE_{i4}$) are employed respectively, and FIG. 8E is a distribution obtained by synthesizing FIG. 8A to FIG. 8D.

Figure 8A:
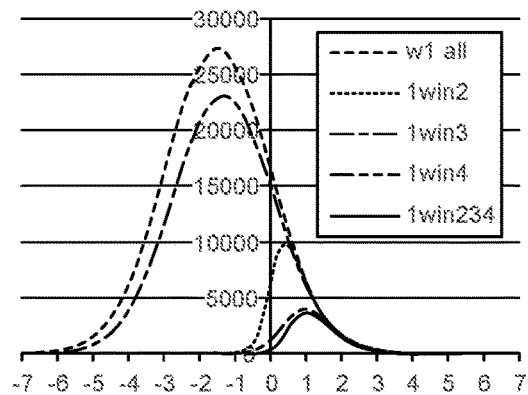
FIG. 8A is an explanatory view illustrating an IPFE distribution in a case where $W_1$ ($IPFE_{i1}$) is employed.
Figure 8B:
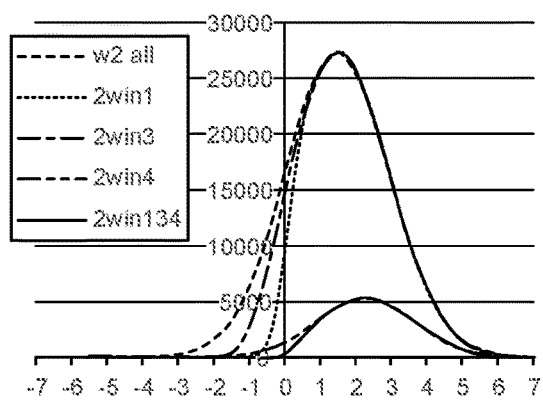
FIG. 8B is an explanatory view illustrating an IPFE distribution in a case where $W_1$ ($IPFE_{i2}$) is employed.
Figure 8C:
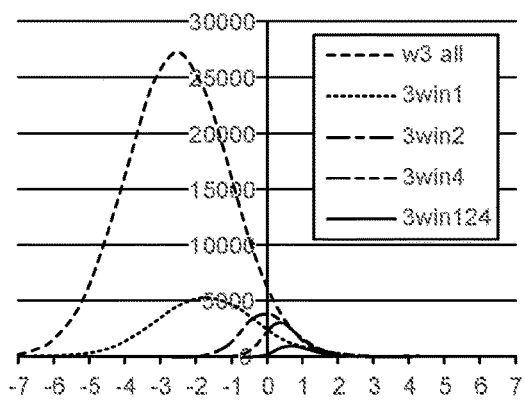
FIG. 8C is an explanatory view illustrating an IPFE distribution in a case where $W_1$ ($IPFE_{i3}$) is employed.
Figure 8D:
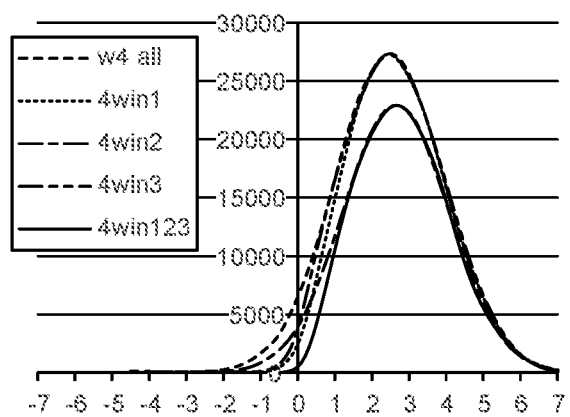
FIG. 8D is an explanatory view illustrating an IPFE distribution in a case where $W_1$ ($IPFE_{i4}$) is employed.
Figure 8E:
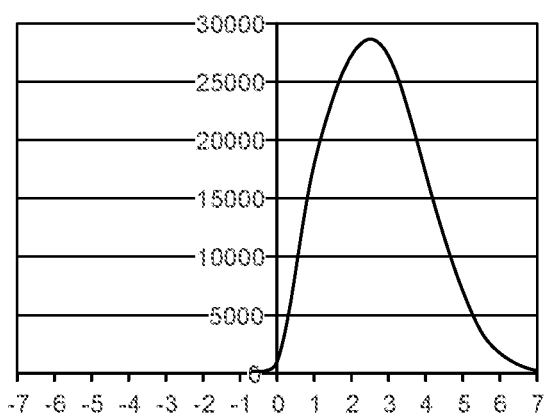
FIG. 8E is an explanatory view illustrating an IPFE distribution obtained by synthesizing FIG. 8A to FIG. 8D.

The case where $W_1$ ($IPFE_{i1}$) is employed as illustrated in FIG. 8A will be described. Among notes in FIG. 8A, "w1 all" is a probability density function $\phi_1$, "1win2" is the cumulative distribution function $\Psi_{12}(x)$, "1win3" is the cumulative distribution function $\Psi_{13}(x)$, "1win4" is the cumulative distribution function $\Psi_{14}(x)$, and "1win234" is the IPFE distribution function F(x). Note that since FIG. 8B to FIG. 8D are the same as FIG. 8A, description thereof will be omitted. FIG. 8E is a function obtained by synthesizing the four IPFE distribution functions F(x) in FIG. 8A to FIG. 8D. Thus, the IPFE distribution is calculated.

When the IPFE distribution function F(x) expressed in above Expression (11) is expressed by the eight parameters OVL, $\Delta L$, $\Delta D$, $\Delta S$, $\sigma_{OVL}$, $\sigma_L$, $\sigma_D$, $\sigma_{LPR}$, for example, the following can be performed.

As one example, a case where a defect of a chip occurs in stacked wafers will be described. In the case where it has been turned out that the critical dimension of the pattern is large as a result of analysis of the detect of the chip, if the treatment conditions are controlled to merely reduce the critical dimension of the pattern, other chips being good products may be influenced. Hence, the IPFE distribution is calculated for each chip, the eight parameters are kept in balance to prevent a part which has been a defective chip from becoming a defect, and the treatment conditions are feedback-controlled to make the defective chip a good product. In this event, influence is slightly exerted on the good chip but is suppressed to a level not to make it a defective product. As a result, the yields can be improved.

As another example, a case where a certain chip is under overload when the wafer is going to be subjected to a next treatment and will certainly become a defective product if the next treatment is performed as it is, will be described. Also in this case, the IPFE distribution is calculated as in the above example, the treatment condition of the next treatment is slightly adjusted, and the treatment is performed in a manner to prevent a defective chip from being produced. In this event, slight influence is exerted even on a good chip, but is suppressed to a level not to make it a defective product. As a result, in the case where correction is performed by the overlay or the critical dimension of the pattern, the information is fed back or fed forward to an exposure apparatus about the overlay. Besides, about the critical dimension, the correction can be distributed to photolithography processing, a film forming treatment, an etching treatment and so on although depending on the steps. Using the good and bad points of the apparatuses and the adjustment knob, an ideal state of the IPFE is achieved. The ideal state of the IPFE is a critical dimension optimal in light of the state of the lower layer pattern and the state of the next upper layer pattern and is not a uniform critical dimension.

(Method of Setting n)

A method of setting n will be described here. Note that in the case where the semiconductor device is, for example, a semiconductor chip, there are, for example, patterns on the order of 100 billion in the semiconductor chip. In this case, when management is performed with n=3, $3\sigma_{OVL}$=4, $3\sigma_L$=2, $3\sigma_D$=3 as in this example, for example, there are about 860 thousand elements having an $IPFE_{i1}$ of larger than 6.5 among the 100 billion patterns, and the about 860 thousand elements become defective. In terms of probability, acceptable products account for 99.9991%.

On the other hand, with n=4.5, $4.5\sigma_{OVL}$=4, $4.5\sigma_L$=2, $4.5\sigma_D$=3, defective patterns among the 100 billion patterns can be decreased to, for example, two patterns. In this case, defective patterns cannot be made completely brought to zero, but the above is realistically a rational value.

With the fluctuation of n in the above manner, the number of defective patterns also fluctuates. The above-described n=3 or n=4.5 is set according to the element of the pattern or the management specifications of the manufacturer of the semiconductor chip.

<Correction of Treatment Conditions Based on the IPFE>

In the manufacturing process of the semiconductor device of the multilayer wiring structure, a plurality of treatments are performed on a wafer as a substrate to form a plurality of patterns stacked on the wafer. Hereinafter, a method of correcting treatment conditions in the predetermined treatments using the IPFE defined as described above will be described.

(IPFE Budget)

In correcting the treatment conditions, the present inventors have introduced the concept of an IPFE budget. As described above, the IPFE is the index for determining the quality of the plurality of stacked patterns. For example, when the IPFE falls within the predetermined threshold, the plurality of patterns are determined to be good, whereas when the IPFE exceeds the predetermined threshold, the plurality of patterns are determined to be defective. The predetermined threshold of the IPFE is an IPFE budget.

Figure 9:
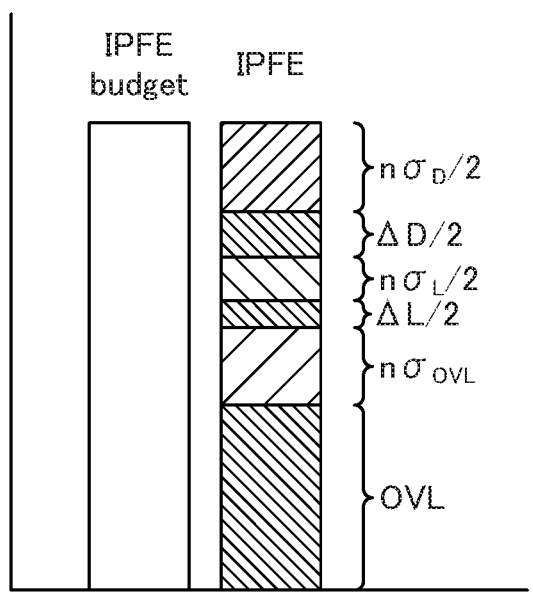
FIG. 9 is an image chart illustrating items constituting the IPFE.

Besides, as expressed in above Expressions (1), (6), the IPFE is a sum of the overlay of the patterns in the two upper and lower layers (OVL+$n\sigma_{OVL}$), the EPE of the lower layer pattern ($\Delta L/2+n\sigma_L/2$), and the EPE of the upper layer pattern ($\Delta D/2+n\sigma_D/2$). FIG. 9 is an image chart illustrating items constituting the IPFE.

For example, in the case where the critical dimension of the lower layer pattern is 13 nm and the stack pattern type of the patterns in the two upper and lower layers is the bridge type, the threshold of the IPFE becomes 6.5 nm. In this case, for example, when the EPE of the lower layer pattern is 2.5 nm and the overlay of the patterns in the two upper and lower layers is 2 nm, the amount allowable for the EPE of the upper layer pattern becomes 6.5 nm. As expressed in above Expression (6), the EPE of the lower layer pattern comes to have an influence rate being half to the IPFE. Accordingly, 6.5 nm that is twice of 3.25 nm (=6.5 nm-2.5 nm/2-2 nm) becomes the amount allowable for the EPE of the upper layer pattern. Then, the treatment condition of the treatment performed in forming the upper layer pattern is decided so that the EPE falls within 6.5 nm. In the above manner, optimum critical dimension and profile of the upper layer pattern are calculated and the treatment condition of the treatment in forming the upper layer pattern is corrected in view of the state of the lower later pattern.

The above is the concept of the IPFE budget and, in short, the allowable amounts of items (the overlay, the EPEs of the upper and lower layers) constituting the IPFE are determined to fall within a range of the IPFE budget, and the treatment conditions of the treatments relating to the items are corrected.

(Method of Correcting the Treatment Conditions)

Next, the method of correcting the treatment conditions will be concretely described using the concept of the above-described IPFE budget.

(Present Status Grasping Step)

First, a predetermined treatment is performed on a wafer to form a lower layer pattern on the wafer. In this event, the variation in critical dimension of the lower layer pattern (and the variation in barycentric position) are measured and the EPE of the lower layer pattern is calculated. On the other hand, from the viewpoint of the IPFE budget, the allowable value of the EPE of the lower layer pattern is calculated in advance. Then, the calculated value of EPE of the lower layer pattern is compared with the allowable value to grasp the status of the wafer and the die (chip).

When the calculated value of the EPE of the lower layer pattern is the allowable value or less and is normal in all of dies on the wafer, subsequent treatments are performed on the wafer.

Besides, when defective dies having a calculated value of the EPE of the lower layer pattern exceeding the allowable value exist but the number of the defective dies is small, the optimal treatment conditions of the subsequent treatments are decided to exclude the defective dies.

Further, when defective dies having a calculated value of the EPE of the lower layer pattern exceeding the allowable value exist and the number of the defective dies is large, a re-treatment is performed on the wafer if rework of the wafer is possible. Alternatively, only good dies may be subjected to the subsequent treatments into products. In the worst case, the wafer is regarded as a defective wafer and discarded without performing the subsequent treatments.

(Feedforward Control)

Next, the overlay of the patterns in the two upper and lower layers and the EPE of the upper layer pattern are calculated from the IPFE budget, based on the above-described calculated value of the EPE of the lower layer pattern. Then, the treatment conditions of the treatments in forming the upper layer pattern are corrected. This is the feedforward control of the treatment conditions. In this event, for example, a relation between the treatment conditions and the EPE (or the critical dimension) of the pattern is found in advance to select and correct the optimal treatment conditions.

The feedforward control enables, for example, correction among wafers. For example, in the case where the difference among wafers occurring in the same treatment apparatus or the difference among treatment apparatuses is the cause of the defect, the average film thickness and the critical dimension distribution of the pattern formed on the wafer are often distinctively deviated. In addition, in the same lot (25 wafers), the wafers are not always treated under the same environment, and therefore correction of the treatment conditions in a single wafer treatment for each wafer become necessary. In the feedforward control, the correction of the treatment conditions in a single wafer treatment becomes possible.

Note that measurement and analysis of the critical dimension of the pattern (and the barycentric position) at all of the points within the wafer takes a lot of time. Hence, several points within the wafer may be measured and the difference among wafers may be grasped from their tendencies. Also in this case, the correction of the treatment conditions in a single wafer treatment becomes possible.

There are various conceivable treatment conditions to be corrected. Examples of the treatment conditions in, for example, the photolithography processing include the film thickness in forming a resist film, the heating time and temperature or their offsets in the thermal treatment (for example, a PAB treatment and a PEB treatment), the developing time, the number of rotations, and selection of a nozzle to be used in the developing treatment, the doze, focus, overlay, distortion in the exposure processing and so on. Further, examples of the treatment conditions in the film forming treatment (deposition) include the film forming amount, the in-plane uniformity of the film thickness and so on. Furthermore, examples of the treatment conditions in the etching treatment include the height of a focus ring, the partial pressure of a source gas, the etching time and so on.

Besides, when the IPFE predicted based on the calculated value of the EPE of the lower layer pattern has a margin relative to the IPFE budget, the wafer may be actively conversely strained to make the overlay in the dies predicted to increase, for example, in the subsequent treatments.

(Feedback Control)

Thereafter, the upper layer pattern is formed on the lower layer pattern of the wafer. In this event, the overlay of the patterns in the two upper and lower layers is measured. Further, the variation in critical dimension of the upper layer pattern (and the variation in barycentric position) is measured, and the EPE of the upper layer pattern is calculated. Then, the IPFE is calculated based on the EPE of the lower layer pattern, the overlay of the patterns in the two upper and lower layers, and the EPE of the upper layer pattern. When the calculated IPFE exceeds the IPFE budget, the treatment conditions for the wafer to be treated next are corrected. This is the feedback control of the treatment conditions. Note that also in the feedback control, a relation between the treatment conditions and the EPE (or the critical dimension) of the pattern is found in advance as in the above-described feedforward control to select and correct the optimal treatment conditions.

According to this embodiment, the feedforward control and the feedback control are repeatedly performed as described above to correct the treatment conditions, thereby enabling optimization of the treatment conditions. Then, treating the wafer on the optimized treatment conditions makes it possible to make the patterns to be formed on the wafer appropriate. As a result, the yields of products can be improved.

Note that for calculation of the IPFE, measurement of the critical dimensions of the patterns on the wafer is important. However, realistically, it is impossible to measure all of the critical dimensions on the entire wafer surface. Hence, the critical dimension is measured at a plurality of measurement points on the wafer, and the IPFE is calculated based on the measurement result.

Further, the measurement of the critical dimension is performed by a measuring apparatus installed in the treatment system. Though any measurement method may be employed in the measuring apparatus, for example, the wafer may be imaged and the critical dimension may be estimated by image analysis. Alternatively, the critical dimension may be measured using the Scatterometry.

However, when such a measuring apparatus is not installed in the treatment system, for example, the critical dimension of the pattern may be measured in advance by CDSEM, and the measured value may be employed as a provisional value.

<Example of Correction of the Treatment Conditions Based on the IPFE>

Next, the correction of the treatment conditions based on the IPFE performed as described above will be described while illustrating a concrete manufacturing process of the semiconductor device.

(Substrate Treatment System)

Figure 10:
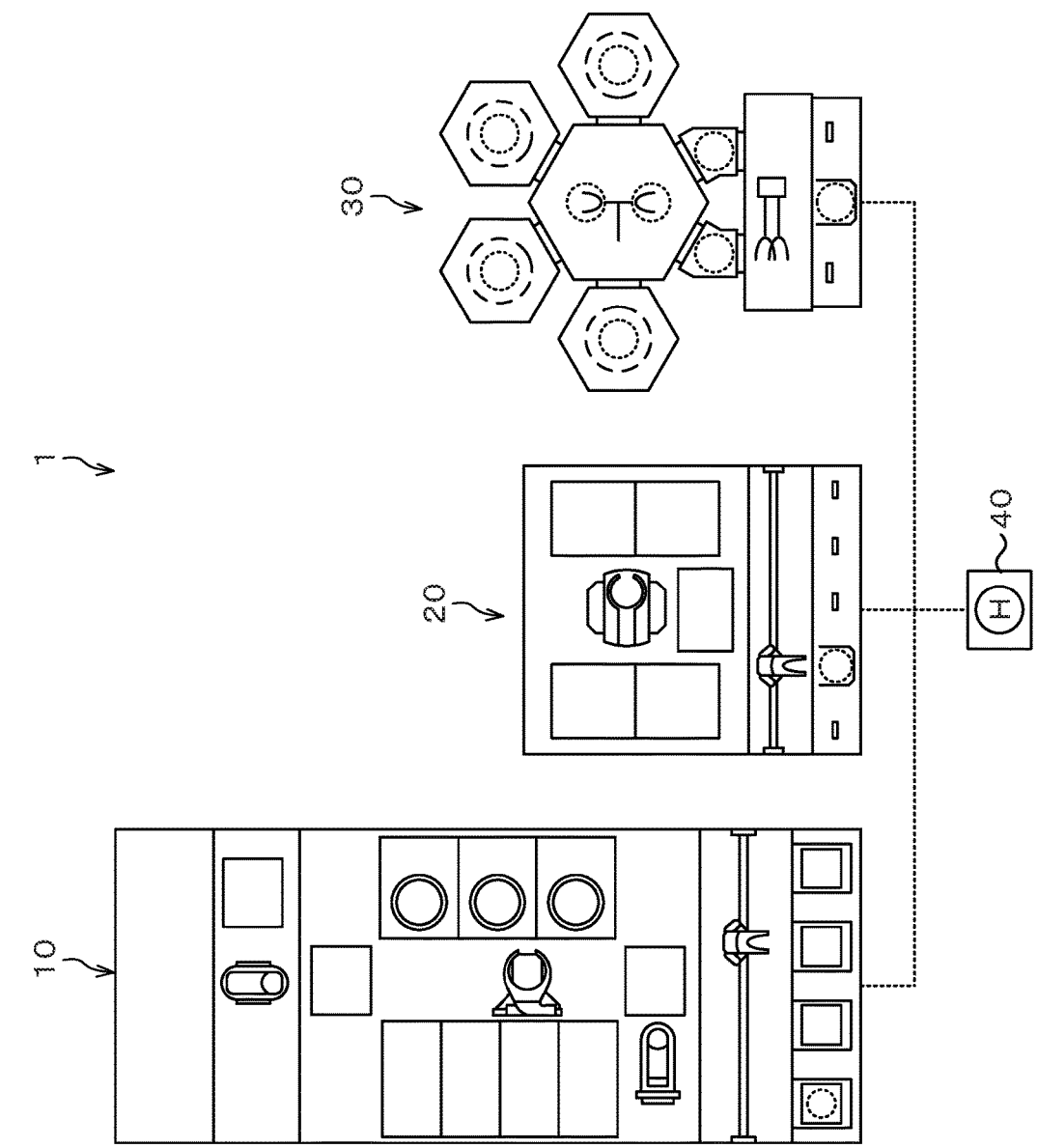
FIG. 10 is a plan view schematically illustrating the outline of the configuration of a substrate treatment system.

First, a configuration of a substrate treatment system according to this embodiment will be described. FIG. 10 is a plan view schematically illustrating the outline of the configuration of a substrate treatment system 1.

The substrate treatment system 1 includes three treatment systems 10, 20, 30 that perform predetermined treatments on the wafer W. The substrate treatment system 1 further includes a control unit 40. The control unit 40 is, for example, a computer and includes a program storage unit (not illustrated). In the program storage unit, a program for controlling the treatments on the wafer W in the substrate treatment system 1 is stored. Note that the program may be the one that is recorded, for example, on a computer-readable storage medium H such as a computer-readable hard disk (HD), flexible disk (FD), compact disk (CD), magneto-optical disk (MO), or memory card, and installed from the storage medium into the control unit 40.

(First Treatment System)

Figure 11:
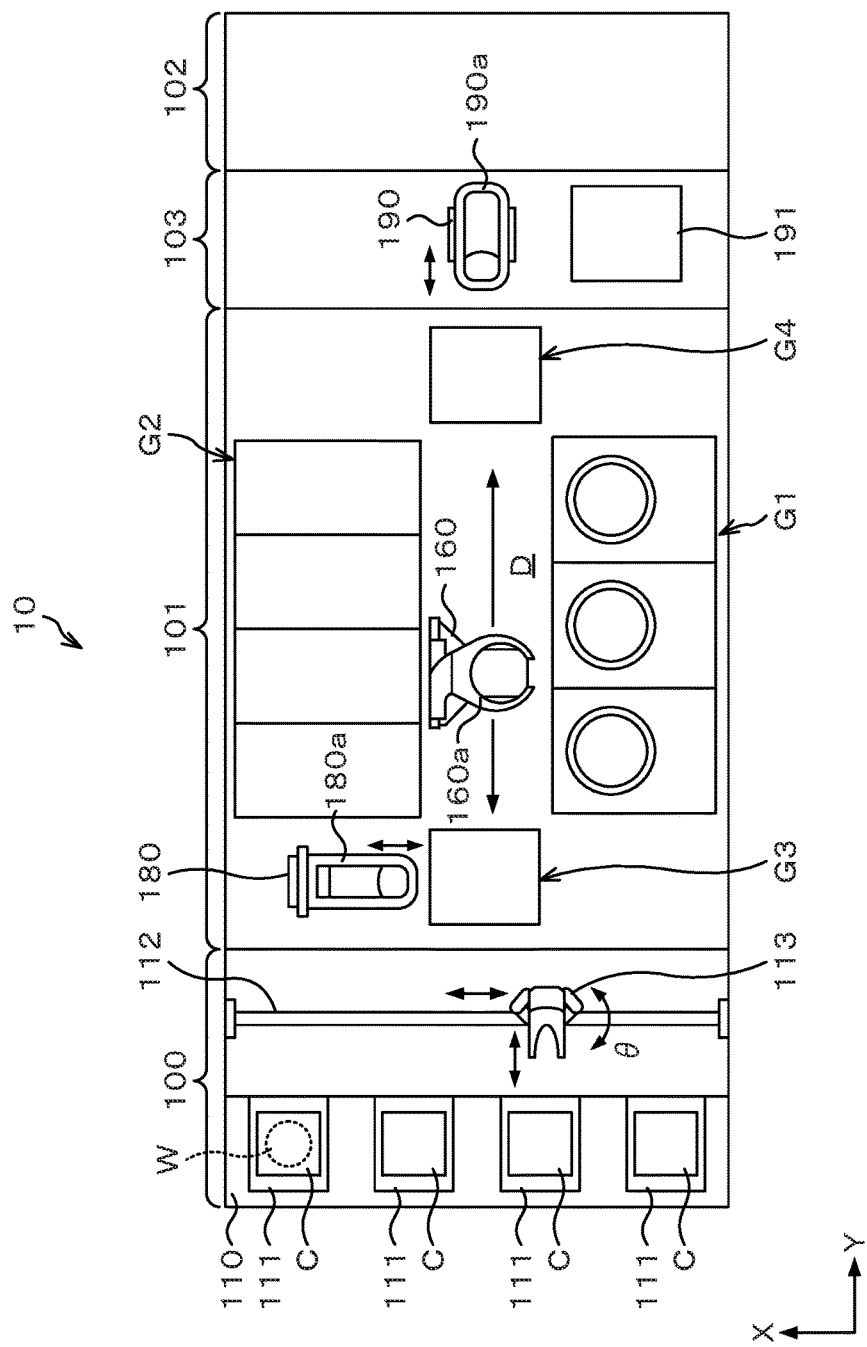
FIG. 11 is a plan view schematically illustrating the outline of the configuration of a first treatment system.
Figure 12:
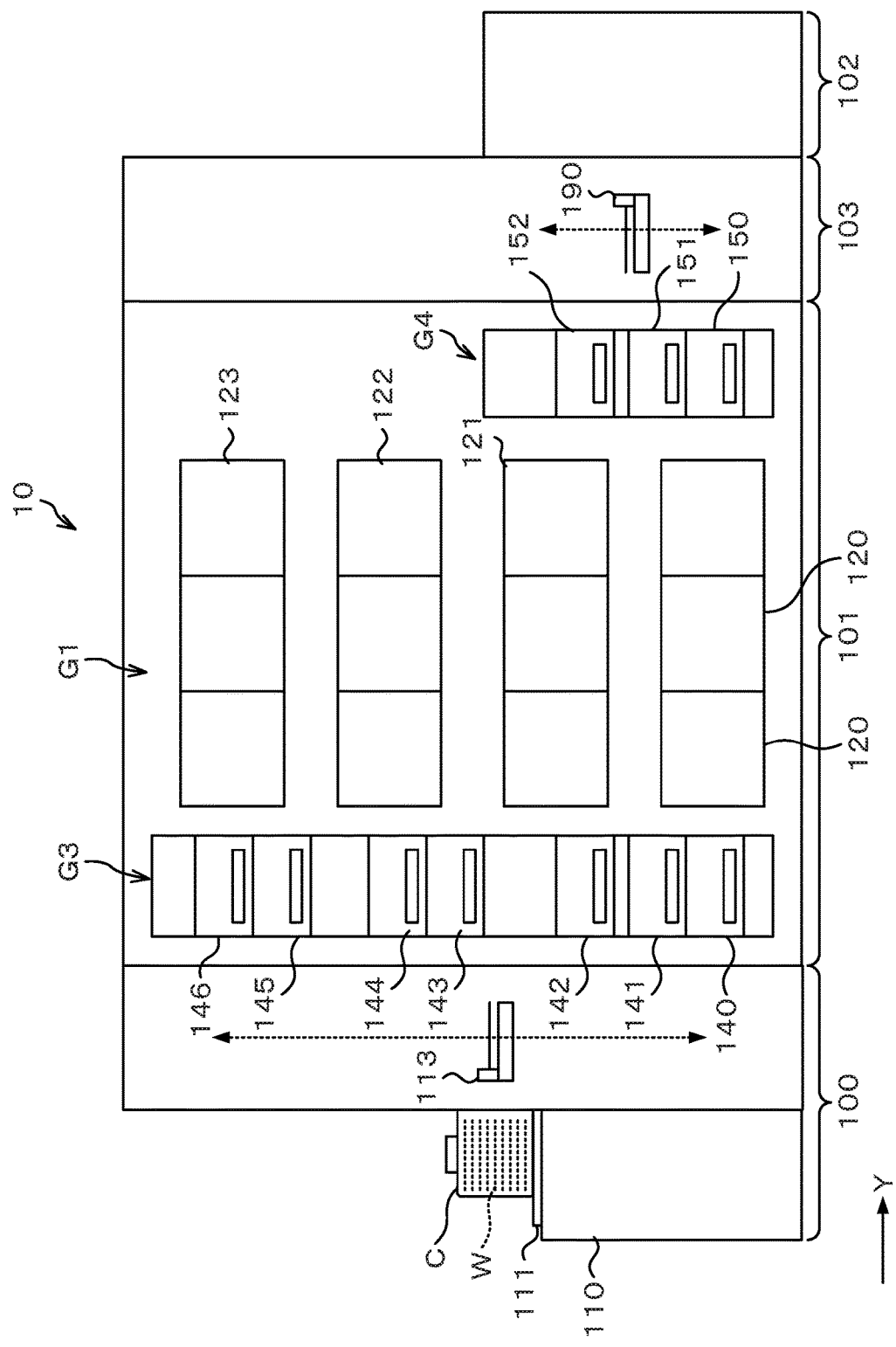
FIG. 12 is a front view schematically illustrating the outline of the internal configuration of the first treatment system.
Figure 13:
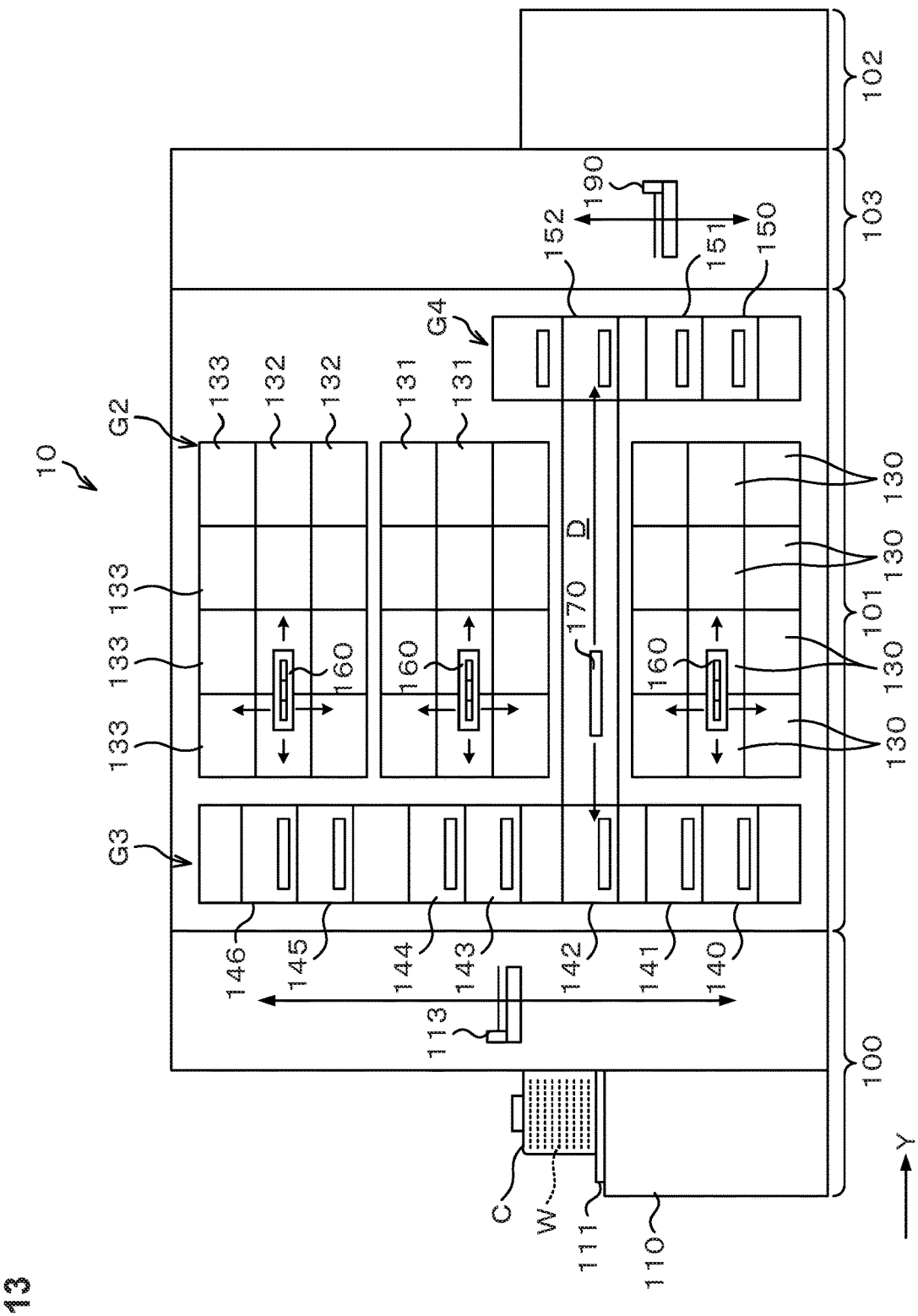
FIG. 13 is a rear view schematically illustrating the outline of the internal configuration of the first treatment system.

In the first treatment system 10, the photolithography processing is performed on the wafer W. FIG. 11 is a plan view schematically illustrating the outline of the configuration of the first treatment system 10. FIG. 12 and FIG. 13 are a front view and a rear view schematically illustrating the outline of the internal configuration of the first treatment system 10, respectively.

The first treatment system 10 has, as illustrated in FIG. 11, a configuration in which a cassette station 100 to/from which a cassette C housing a plurality of wafers W is transferred in/out, a treatment station 101 which includes a plurality of treatment apparatuses performing predetermined treatments on the wafer W, and an interface station 103 which delivers the wafer W to/from an exposure apparatus 102 adjacent to the treatment station 101, are integrally connected.

In the cassette station 100, a cassette mounting table 110 is provided. On the cassette mounting table 110, a plurality of cassette mounting plates 111 are provided on which the cassettes C are mounted when the cassettes C are transferred in/out from/to the outside of the substrate treatment system 1.

In the cassette station 100, a wafer transfer apparatus 113 is provided which is movable on a transfer path 112 extending in an X-direction. The wafer transfer apparatus 113 is movable also in an up-down direction and around a vertical axis (in a θ-direction), and can transfer the wafer W between the cassette C on each of the cassette mounting plates 111 and a delivery apparatus included in a later-described third block G3 in the treatment station 101.

In the treatment station 101, a plurality of, for example, four blocks, namely, a first block G1 to a fourth block G4 are provided each including various apparatuses. For example, the first block G1 is provided on the front side (an X-direction negative direction side in FIG. 11) in the treatment station 101, and the second block G2 is provided on the rear side (an X-direction positive direction side in FIG. 11, on the upper side in the drawing) in the treatment station 101. Further, the already described third block G3 is provided on the cassette station 100 side (a Y-direction negative direction side in FIG. 11) in the treatment station 101, and the fourth block G4 is provided on the interface station 103 side (a Y-direction positive direction side in FIG. 11) in the treatment station 101.

In the first block G1, as illustrated in FIG. 12, a plurality of solution treatment apparatuses, for example, developing treatment apparatuses 120 each of which performs a developing treatment on the wafer W, lower anti-reflection film forming apparatuses 121 each of which forms an anti-reflection film (hereinafter, referred to as a "lower anti-reflection film") in a lower layer of a resist film of the wafer W, resist coating apparatuses 122 each of which applies a resist solution to the wafer W to form a resist film, and upper anti-reflection film forming apparatuses 123 each of which forms an anti-reflection film (hereinafter, referred to as an "upper anti-reflection film") in an upper layer of the resist film of the wafer W, are arranged in this order from the bottom.

For example, the developing treatment apparatus 120, the lower anti-reflection film forming apparatus 121, the resist coating apparatus 122, and the upper anti-reflection film forming apparatus 123 are arranged three each to line up in the horizontal direction. Note that the numbers and the arrangement of the developing treatment apparatuses 120, the lower anti-reflection film forming apparatuses 121, the resist coating apparatuses 122, and the upper anti-reflection film forming apparatuses 123 can be arbitrarily selected.

In each of the developing treatment apparatus 120, the lower anti-reflection film forming apparatus 121, the resist coating apparatus 122, and the upper anti-reflection film forming apparatus 123, for example, spin coating of applying a predetermined treatment solution onto the wafer W is performed. In the spin coating, the treatment solution is discharged, for example, from a coating nozzle onto the wafer W, and the wafer W is rotated to diffuse the treatment solution over the surface of the wafer W.

In the second block G2, as illustrated in FIG. 13, thermal treatment apparatuses 130 each of which performs thermal treatments such as heating and cooling of the wafer W, hydrophobizing treatment apparatuses 131 each of which performs a hydrophobizing treatment for enhancing fixation between a resist solution and the wafer W, edge exposure apparatuses 132 each of which exposes the outer peripheral portion of the wafer W to light, and measuring apparatuses 133 each of which measures the film thickness of the resist film formed on the wafer W and the dimension of the resist pattern are provided to line up in the vertical direction and in the horizontal direction. The numbers and the arrangement of the thermal treatment apparatuses 130, the hydrophobizing treatment apparatuses 131, the edge exposure apparatuses 132, and the measuring apparatuses 133 can be arbitrarily selected. Further, for the thermal treatment apparatus 130, the hydrophobizing treatment apparatus 131, the edge exposure apparatus 132, and the measuring apparatus 133, publicly-known apparatuses can be used respectively.

In the third block G3, a plurality of delivery apparatuses 140, 141, 142, 143, 144, 145, 146 are provided in order from the bottom. Further, in the fourth block G4, a plurality of delivery apparatuses 150, 151, 152 are provided in order from the bottom.

In a region surrounded by the first block G1 to the fourth block G4, a wafer transfer region D is formed as illustrated in FIG. 11. In the wafer transfer region D, for example, a plurality of wafer transfer apparatuses 160 are arranged each of which has a transfer arm 160a movable, for example, in the Y-direction, the X-direction, the θ-direction, and the vertical direction. The wafer transfer apparatus 160 can move in the wafer transfer region D to transfer the wafer W to a predetermined apparatus in the first block G1, the second block G2, the third block G3 and the fourth block G4 therearound.

Further, in the wafer transfer region D, a shuttle transfer apparatus 170 is provided which linearly transfers the wafer W between the third block G3 and the fourth block G4 as illustrated in FIG. 13.

The shuttle transfer apparatus 170 is configured to be linearly movable, for example, in the Y-direction in FIG. 13. The shuttle transfer apparatus 170 can move in the Y-direction while supporting the wafer W, and transfer the wafer W between the delivery apparatus 142 in the third block G3 and the delivery apparatus 152 in the fourth block G4.

As illustrated in FIG. 11, a wafer transfer apparatus 180 is provided adjacent on the X-direction positive direction side of the third block G3. The wafer transfer apparatus 180 has a transfer arm 180a that is movable, for example, in the X-direction, the θ-direction, and the vertical direction. The wafer transfer apparatus 180 can move up and down while supporting the wafer W to transfer the wafer W to each of the delivery apparatuses in the third block G3.

In the interface station 103, a wafer transfer apparatus 190 and a delivery apparatus 191 are provided. The wafer transfer apparatus 190 has a transfer arm 190a that is movable, for example, in the Y-direction, the θ-direction, and the vertical direction. The wafer transfer apparatus 190 can transfer the wafer W to/from each of the delivery apparatuses in the fourth block G4, the delivery apparatus 191 and the exposure apparatus 102, for example, while supporting the wafer W by the transfer arm 190a.

(Second Treatment System)

Figure 14:
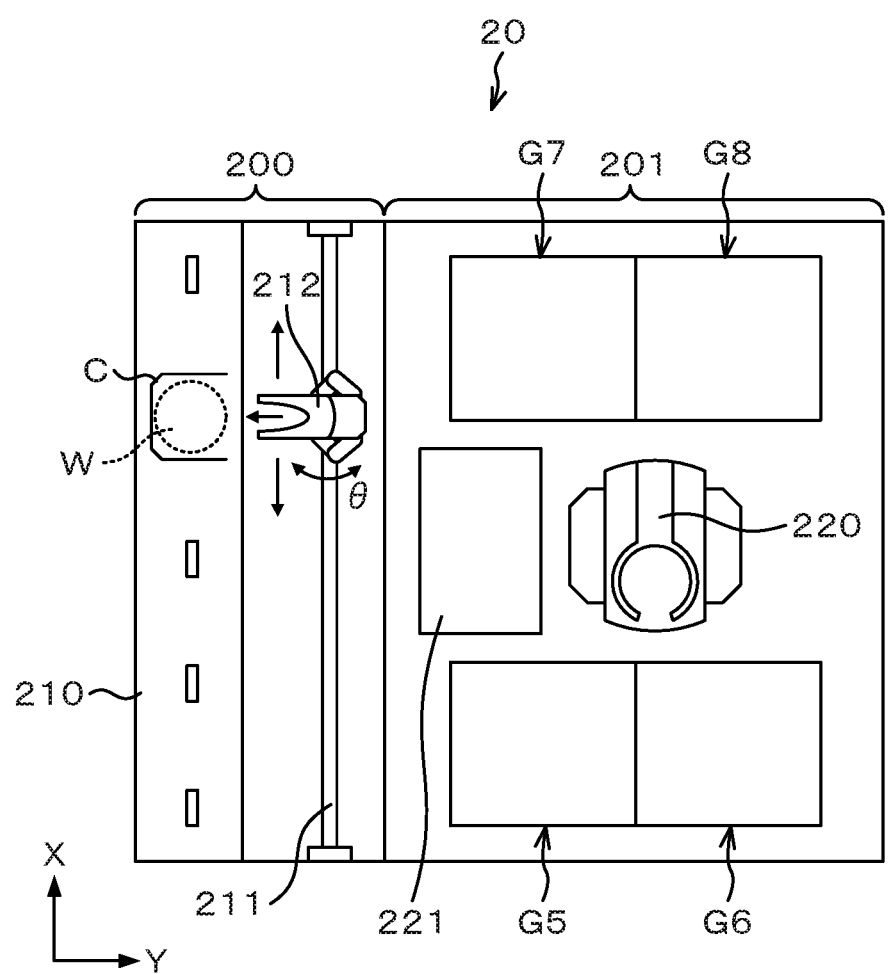
FIG. 14 is a plan view schematically illustrating the outline of the configuration of a second treatment system.
Figure 15:
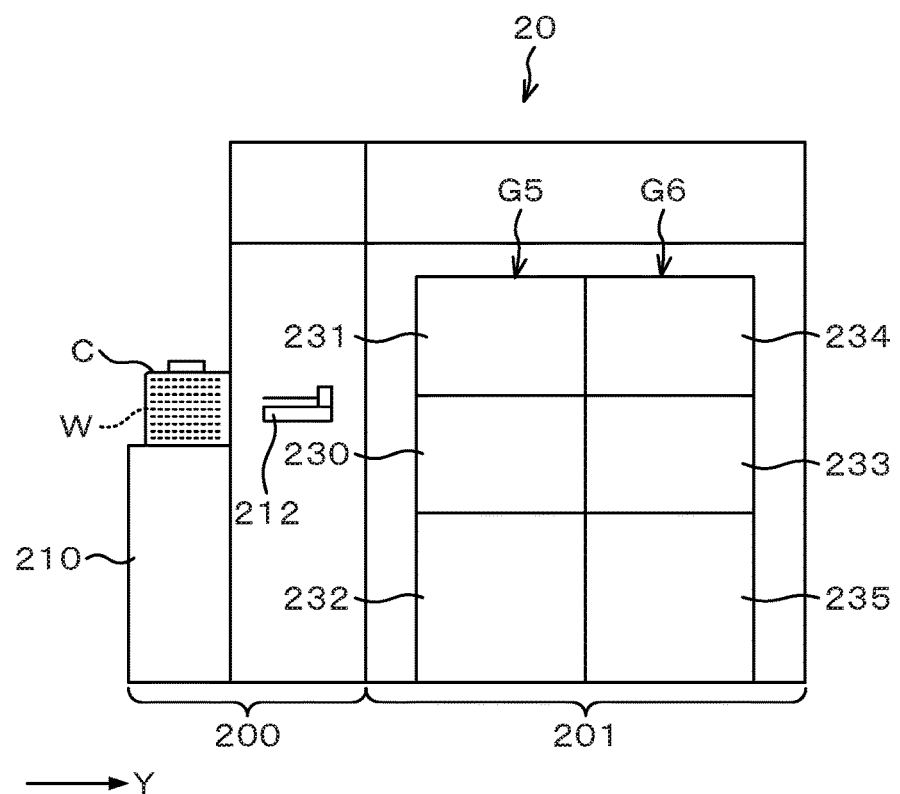
FIG. 15 is a front view schematically illustrating the outline of the internal configuration of the second treatment system.
Figure 16:
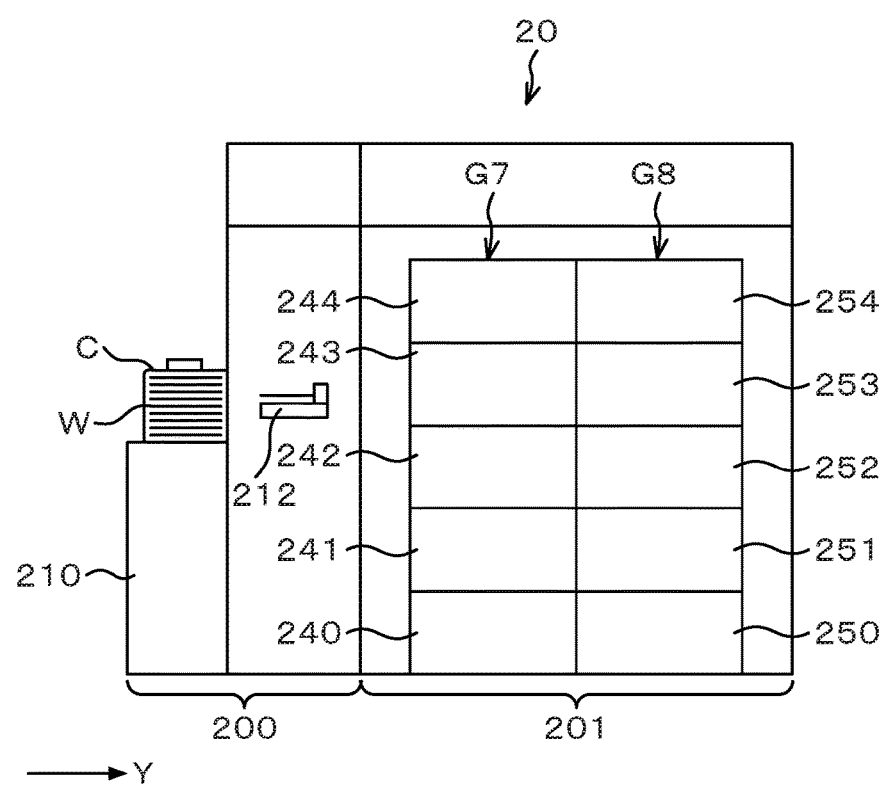
FIG. 16 is a rear view schematically illustrating the outline of the internal configuration of the second treatment system.

In the second treatment system 20, a film forming treatment for forming predetermined films (an SOC film and an SOG film) on the wafer W is performed. FIG. 14 is a plan view schematically illustrating the outline of the configuration of the second treatment system 20. FIG. 15 and FIG. 16 are a front view and a rear view schematically illustrating the outline of the internal configuration of the second treatment system 20, respectively.

The second treatment system 20 has, as illustrated in FIG. 14, a configuration in which a cassette station 200 to/from which a cassette C housing a plurality of wafers W is transferred in/out and a treatment station 201 which includes a plurality of treatment apparatuses performing predetermined treatments on the wafer W are integrally connected.

In the cassette station 200, a cassette mounting table 210 is provided. The cassette mounting table 210 is configured such that a plurality of cassettes C can be mounted in a line in an X-direction (in a vertical direction in FIG. 14).

In the cassette station 200, a wafer transfer apparatus 212 is provided which is movable on a transfer path 211 extending in the X-direction. The wafer transfer apparatus 212 is movable also in an up-down direction and around a vertical axis (in a θ-direction), and can transfer the wafer W between the cassette C and the treatment station 201.

In the treatment station 201, a wafer transfer apparatus 220 is provide at its center part. Around the wafer transfer apparatus 220, for example, four treatment blocks G5 to G8 are provided in each of which various treatment apparatuses are arranged in multiple tiers. On the front side (on an X-direction negative direction side in FIG. 14) in the treatment station 201, the first treatment block G5 and the second treatment block G6 are arranged in order from the cassette station 200 side. On the rear side (on an X-direction positive direction side in FIG. 14) in the treatment station 201, the third treatment block G7 and the fourth treatment block G8 are arranged in order from the cassette station 200 side. On the cassette station 200 side in the treatment station 201, a delivery apparatus 221 for delivering the wafer W is arranged. The wafer transfer apparatus 220 can transfer the wafer W to later-described various treatment apparatuses arranged in the treatment blocks G5 to G8 and the delivery apparatus 221.

In the first treatment block G5, as illustrated in FIG. 15, a plurality of solution treatment apparatuses, for example, SOC coating apparatuses 230, 231 each of which applies an SOC material for forming an SOC film on the wafer W are provided in two tiers in order from the bottom. In the lowermost tier of the first treatment block G5, a chemical chamber 232 for supplying the SOC material to the SOC coating apparatuses 230, 231 is provided. In the second treatment block G6, for example, SOG treatment apparatuses 233, 234 each of which applies an SOG material for forming an SOG film on the wafer W are provided in two tiers in order from the bottom. In the lowermost tier of the second treatment block G6, a chemical chamber 235 for supplying the SOG material to the SOG treatment apparatuses 233, 234 is provided.

In the SOC coating apparatuses 230, 231 and the SOG treatment apparatuses 233, 234, for example, spin coating of applying a predetermined treatment solution onto the wafer W is performed. In the spin coating, the treatment solution is discharged, for example, from a coating nozzle onto the wafer W, and the wafer W is rotated to diffuse the treatment solution over the surface of the wafer W.

In the third treatment block G7, as illustrated in FIG. 16, thermal treatment apparatuses 240 to 244 each of which performs thermal treatments such as heating and cooling of the wafer W are provided in five tiers in order from the bottom. In the fourth treatment block G8, thermal treatment apparatuses 250 to 252, and measuring apparatuses 253, 254 each of which measures the film thicknesses of the SOC film and the SOG film formed on the wafer W are provided in five tiers in order from the bottom. Note that for the thermal treatment apparatuses 240 to 244, 250 to 252, and the measuring apparatuses 253, 254, publicly-known apparatuses can be used respectively.

(Third Treatment System)

Figure 17:
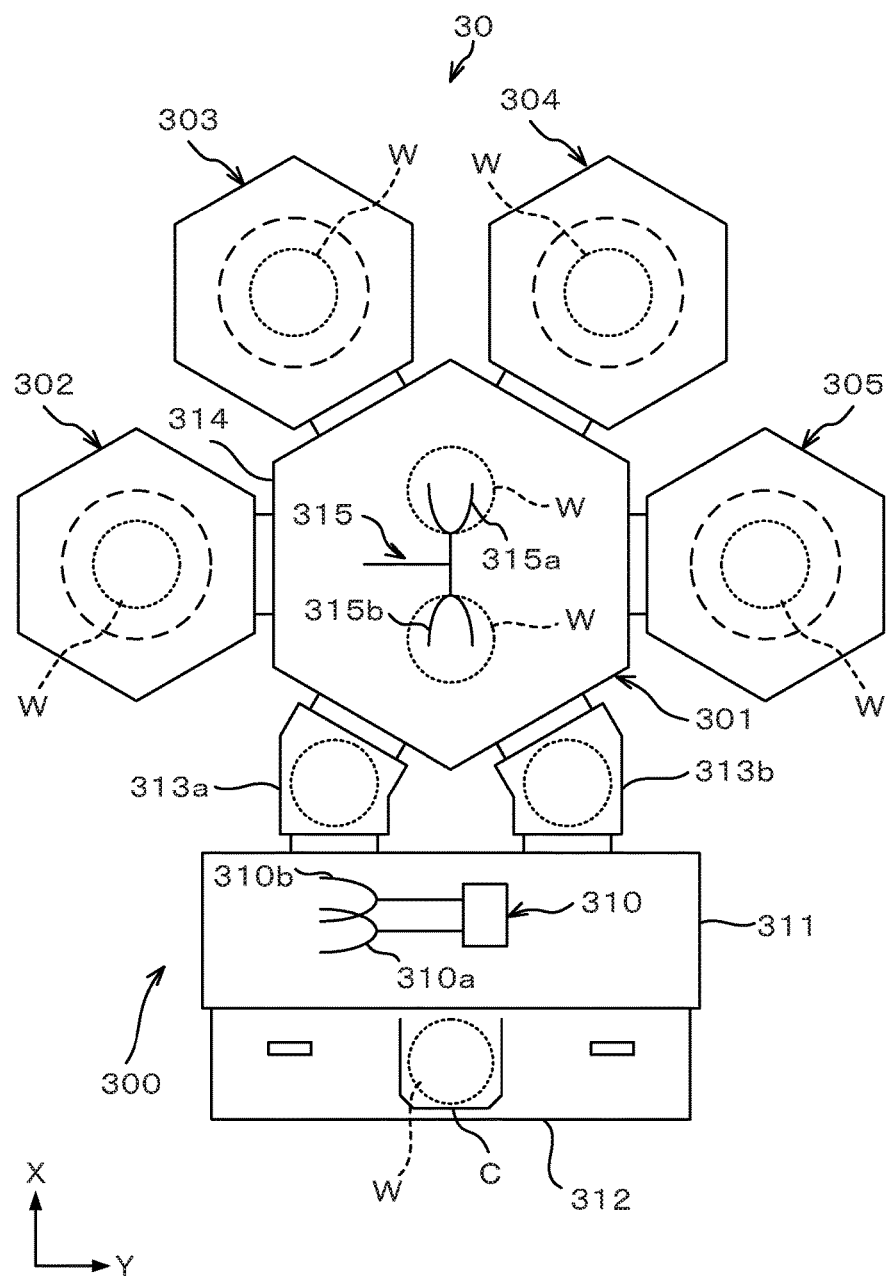
FIG. 17 is a plan view schematically illustrating the outline of the configuration of a third treatment system.

In the third treatment system 30, a film forming treatment of forming a predetermined film on the wafer W and an etching treatment on the wafer W are performed. FIG. 17 is a plan view schematically illustrating the outline of the configuration of the third treatment system 30.

The third treatment system 30 includes, as illustrated in FIG. 17, a cassette station 300 to/from which a cassette C housing a plurality of wafers W is transferred in/out, a common transfer unit 301 which transfers the wafer W, a TiN film forming apparatus 302 which forms a TiN film on the wafer W, a spacer film forming apparatus 303 which forms a spacer film on the wafer W, an etching apparatus 304 which etches the predetermined on the wafer W, and a measuring apparatus 305 which measures the film thickness of the predetermined film formed on the wafer W and the dimension of the pattern.

Each of the TiN film forming apparatus 302 and the spacer film forming apparatus 303 is, for example, a CVD (Chemical Vapor Deposition) apparatus using, for example, plasma. For the etching apparatus 304, an RIE (Reactive Ion Etching) apparatus is used. Note that for the TiN film forming apparatus 302, the spacer film forming apparatus 303, the etching apparatus 304, and the measuring apparatus 305, publicly-known apparatuses can be used respectively.

The cassette station 300 has a transfer room 311 in which a wafer transfer apparatus 310 transferring the wafer W is provided. The wafer transfer apparatus 310 has two transfer arms 310a, 310b which substantially horizontally hold the wafer W, and is configured to transfer the wafer W while holding the wafer W by one of the transfer arms 310a, 310b. Beside the transfer room 311, a cassette mounting table 312 is provided on which the cassettes C capable of housing a plurality of wafers W lined up are mounted. In the illustrated example, a plurality of, for example, three cassettes C can be mounted on the cassette mounting table 312.

The transfer room 311 and the common transfer unit 301 are coupled to each other via two load-lock apparatuses 313a, 313b which can be evacuated.

The common transfer unit 301 has a transfer room chamber 314 having a hermetically closable structure formed in a substantially polygonal shape (a hexagonal shape in the illustrated example) as seen from above. In the transfer room chamber 314, a wafer transfer apparatus 315 which transfers the wafer W is provided. The wafer transfer apparatus 315 has two transfer arms 315a, 315b each of which substantially horizontally holds the wafer W and is configured to transfer the wafer W while holding the wafer W by one of the transfer arms 315a, 315b.

Outside the transfer room chamber 314, the TiN film forming apparatus 302, the spacer film forming apparatus 303, the etching apparatus 304, the measuring apparatus 305, and the load-lock apparatuses 313b, 313a are arranged to surround the periphery of the transfer room chamber 314. The TiN film forming apparatus 302, the spacer film forming apparatus 303, the etching apparatus 304, the measuring apparatus 305, and the load-lock apparatuses 313b, 313a are arranged to line up in this order, for example, in the clockwise direction as seen from above, and to face six side surface portions of the transfer room chamber 314, respectively.

Note that the configuration of the substrate treatment system 1 in this embodiment is one example for executing the substrate treatment method in this disclosure but is not limited to the above.

(Substrate Treatment Method)

Figure 18:
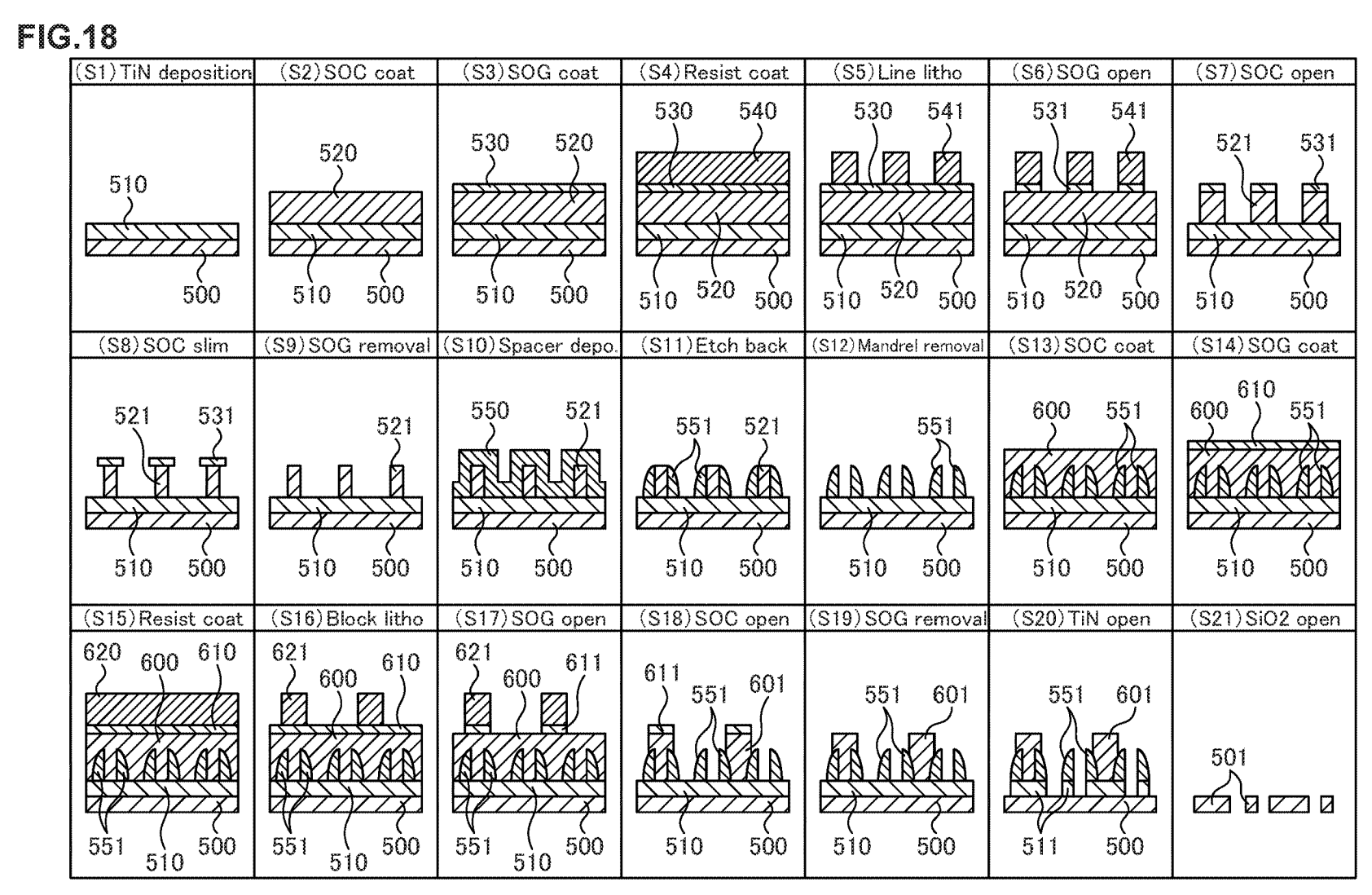

Next, the substrate treatment method performed in the substrate treatment system 1 configured as described above will be described. The substrate treatment in this embodiment is a manufacturing process of the semiconductor device. FIG. 18 is an explanatory view illustrating the states on the wafer at Steps S1 to S21 of the manufacturing process of the semiconductor device. FIG. 19 is a list of treatment items and measurement items at Steps S1 to S21 of the manufacturing process of the semiconductor device. Note that in the manufacturing process of this embodiment, an $SiO_2$ film 500 has been formed in advance on the wafer.

(Step S1)

First, a TiN film 510 is formed on the SiO$_2$ film 500 in the TiN film forming apparatus 302. Then, the film thickness of the TiN film 510 is measured in the measuring apparatus 305.

(Step S2)

Next, an SOC film 520 is applied on the TiN film 510 in the SOC coating apparatus 230, and thereafter the SOC film 520 is subjected to a heat treatment in the thermal treatment apparatus 240. Then, the film thickness of the SOC film 520 is measured in the measuring apparatus 253.

(Step S3)

Next, an SOG film 530 is applied on the SOC film 520 in the SOG treatment apparatus 233, and thereafter the SOG film 530 is subjected to a heat treatment in the thermal treatment apparatus 250. Then the film thickness of the SOG film 530 is measured in the measuring apparatus 254.

(Step S4)

Next, a resist film 540 is applied on the SOG film 530 in the resist coating apparatus 122, and thereafter the resist film 540 is subjected to a heat treatment (a PAB treatment) in the thermal treatment apparatus 130. Then, the film thickness of the resist film 540 is measured in the measuring apparatus 133.

(Step S5)

Next, the resist film 540 is subjected to exposure processing into a predetermined pattern in the exposure apparatus 102, the resist film 540 subjected to the exposure processing is subjected to a heat treatment (a PEB treatment) in the thermal treatment apparatus 130, and then the resist film 540 is subjected to a developing treatment in the developing treatment apparatus 120. Thus, a resist pattern 541 is formed on the SOG film 530. Then, the critical dimension of the resist pattern 541 is measured in the measuring apparatus 133. Note that the resist pattern 541 is a pattern of a line and space in this embodiment.

(Step S6)

Next, the SOG film 530 is etched using the resist pattern 541 as a mask in the etching apparatus 304, whereby an SOG pattern 531 is formed on the SOC film 520. Then, the critical dimensions of the resist pattern 541 and the SOG pattern 531 are measured in the measuring apparatus 305.

(Step S7)

Next, the SOC film 520 is etched using the SOG pattern 531 as a mask in the etching apparatus 304, whereby an SOC pattern 521 is formed on the TiN film 510. Thereafter, the resist pattern 541 is removed. Then, the critical dimensions of the SOG pattern 531 and the SOC pattern 521 are measured in the measuring apparatus 305.

(Step S8)

Next, trimming is performed on the SOC pattern 521 in the etching apparatus 304 to reduce its critical dimension. Then, the critical dimensions of the SOG pattern 531 and the SOC pattern 521 are measured in the measuring apparatus 305.

(Step S9)

Next, the SOG pattern 531 is removed in the etching apparatus 304. Then, the critical dimension of the SOC pattern 521 is measured in the measuring apparatus 305.

(Step S10)

Next, a spacer film 550 is formed on the TiN film 510 in a manner to cover the SOC pattern 521 in the spacer film forming apparatus 303. For the spacer film 550, for example, a SiO$_2$ film is used. Then, the critical dimension of the spacer film 550 is measured in the measuring apparatus 305.

(Step S11)

Next, etch-back is performed on the spacer film 550 in the etching apparatus 304 to form a spacer pattern 551 on the TiN film 510. Then, the critical dimension of the spacer pattern 551 is measured in the measuring apparatus 305.

(Step S12)

Next, the SOC pattern 521 is removed in the etching apparatus 304. Then, the critical dimension of the spacer pattern 551 is measured in the measuring apparatus 305.

(Step S13)

Next, an SOC film 600 is applied on the TiN film 510 in a manner to cover the spacer pattern 551 in the SOC coating apparatus 230, and then the SOC film 600 is subjected to a heat treatment in the thermal treatment apparatus 240. Then, the film thickness and the level difference (flatness) of the SOC film 600 are measured in the measuring apparatus 253.

(Step S14)

Next, an SOG film 610 is applied on the SOC film 600 in the SOG treatment apparatus 233, and then the SOG film 610 is subjected to a heat treatment in the thermal treatment apparatus 250. Then, the film thickness of the SOG film 610 is measured in the measuring apparatus 254.

(Step S15)

Next, a resist film 620 is applied on the SOG film 610 in the resist coating apparatus 122, and thereafter the resist film 620 is subjected to a heat treatment (a PAB treatment) in the thermal treatment apparatus 130. Then, the film thickness of the resist film 620 is measured in the measuring apparatus 133.

(Step S16)

Next, the resist film 620 is subjected to exposure processing into a predetermined pattern in the exposure apparatus 102, the resist film 620 subjected to the exposure processing is subjected to a heat treatment (a PEB treatment) in the thermal treatment apparatus 130, and then the resist film 620 is subjected to a developing treatment in the developing treatment apparatus 120. Thus, a resist pattern 621 is formed on the SOG film 610. In this event, the overlay is measured in the exposure apparatus 102. Further, the critical dimension of the resist pattern 621 is measured in the measuring apparatus 133. Note that the resist pattern 621 is a pattern of a block in this embodiment.

(Step S17)

Next, the SOG film 610 is etched using the resist pattern 621 as a mask in the etching apparatus 304, whereby an SOG pattern 611 is formed on the SOC film 600. Then, the critical dimensions of the resist pattern 621 and the SOG pattern 611 are measured in the measuring apparatus 305.

(Step S18)

Next, the SOC film 600 is etched using the SOG pattern 611 as a mask in the etching apparatus 304, whereby an SOC pattern 601 is formed on the TiN film 510. Further, the resist pattern 621 is removed in this event. Then, the critical dimensions of the SOG pattern 611 and the SOC pattern 601 are measured in the measuring apparatus 305.

(Step S19)

Next, the SOG pattern 611 is removed in the etching apparatus 304. Then, the critical dimension of the SOC pattern 601 is measured in the measuring apparatus 305.

(Step S20)

Next, etching is performed on the TiN film 510 using the SOC pattern 601 as a mask in the etching apparatus 304 to form a TiN pattern 511 on the SiO$_2$ film 500. Then, the critical dimension of the TiN pattern 511 is measured in the measuring apparatus 305.

(Step S21)

Next, etching is performed on the SiO$_2$ film 500 using the TiN pattern 511 as a mask to form a SiO$_2$ pattern 501 on the wafer in the etching apparatus 304. Thereafter, the SOC pattern 601, the spacer pattern 551, and the TiN pattern 511 are removed. Then, the critical dimension of the SiO$_2$ pattern 501 is measured in the measuring apparatus 305.

Above Steps S1 to S21 are examples of the manufacturing process. By repeatedly performing Steps S1 to S21, the semiconductor device of the multilayer wiring structure is manufactured.

(Feedforward Control and Feedback Control)

Next, the case where the feedforward control and the feedback control in this embodiment are performed at above-described Step S1 to S21 will be described.

It is preferable that each of the critical dimensions of the spacer pattern 551 of the line and space formed at Step S12 (the lower layer pattern) and the SOC pattern 601 of the block formed at Step S19 (the upper layer pattern) is uniform. Hence, if there is variation in the critical dimensions, for the spacer pattern 551 at Step S12, the treatments at Step S2 to S11 at previous stages thereto are improved. Besides, for the SOG film 610 at Step S10, the treatments at Step S13 to S18 at previous stages thereto are improved. In improving the treatments, a relation between the treatment condition of each treatment and the critical dimension (or the EPE) of the pattern is obtained in advance, and the treatment condition is corrected based on the relation.

(First Example of Control)

In this embodiment, since the lower layer pattern is the spacer pattern 551 and the upper layer pattern is the SOC pattern 601, the final IPFE is decided at Step S19. However, the overlay is measured at Step S16, and the IPFE not including the EPE of the upper layer pattern can be calculated also at Step 16. Hence, it is determined to perform which one of (1) improvement of the lower layer pattern, (2) improvement of the overlay, and (3) improvement of the upper layer pattern in view of the IPFE calculated at Step 16. For example, in the case of (2) and (3), re-treatment is performed on the wafer if rework is necessary. On the other hand, in the case of (1), rework cannot be performed since the lower layer pattern has been already formed, and therefore, for example, the subsequent treatments are performed only on good dies or the wafer is discarded.

In any of the cases (1) to (3), the correction amount of the treatment condition of each treatment is calculated for the next wafer (or the next lot) and feedback control is performed. In this event, the treatment conditions of a plurality of treatments may be corrected to prevent load from being applied to, for example, a specific treatment. Further, when the IPFE to be calculated has a margin relative to the IPFE budget, the wafer may be actively conversely strained to make the overlay in the dies predicted to increase, for example, in the subsequent treatments.

(Second Example of Control)

Though it is ideal that the critical dimension of any pattern is uniform in the state until Step S12, there is actually a difference among wafers occurring in the same treatment apparatus. Hence, classification of the states of the space pattern 551 at Step S12 enables calculation of a difference among treatment apparatuses. The difference among treatment apparatuses is fed back to the next wafer (or the next lot), and the treatment conditions are corrected.

On the other hand, in the case where there is a difference among wafers, in order to perform the treatments under the optimum treatment conditions at Step S13 and thereafter, optimum solutions of the treatment conditions are predicted based on the difference among wafers and feedforward control is performed on the treatments. Further, the results are collected, and feedback control to the next wafer (or the next lot) is performed. For example, when the critical dimension of the resist pattern 541 has become larger than the target value at Step S5, feedforward control is performed to achieve an ideal critical dimension at Step S6 to Step S8. Then, the result is fed back to the treatment conditions for the next wafer (or the next lot).

(Third Example of Control)

For example, when the critical dimension of the space pattern 551 measured at Step S12 is smaller than the target value, feedback control or feedforward control is performed to correct the treatment condition of each treatment.

As the feedback control, for example, the doze amount in the exposure processing and the developing time in the developing treatment are corrected, for example, for the next wafer (or the next lot), thereby setting the critical dimension of the space pattern 551 to the target value.

Figure 20:
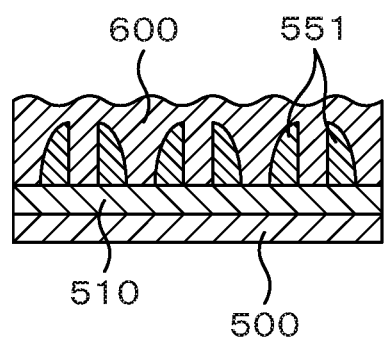
FIG. 20 is an explanatory view illustrating an appearance where an SOC film is applied on a spacer pattern having a small critical dimension.

As the feedforward control, the following is performed. If the treatments at Step S13 and thereafter are performed as they are on the wafer for which the treatment at Step S12 has been finished, gaps into which the SOC film 600 is embedded increase because the SOC film 600 is applied on the space pattern 551 having a small critical dimension as illustrated in FIG. 20. Then, the SOC film 600 becomes thinner and larger in surface roughness than usual. As a result, it is impossible to form the SOC pattern 601 with an appropriate critical dimension at an appropriate position at Step S19. Hence, feedforward control is performed on the treatments at Step S13 and thereafter to correct the treatment conditions.

There are various treatment conditions to be concretely corrected, and one example thereof is as follows. For example, to improve thinning of the SOC film 600, the number of rotations is reduced in the coating treatment of the SOC film 600 at Step S13 to thereby make the SOC film 600 into a thick film.

Further, since there is roughness of the surface of the SOC film 600, offset is applied to reading of the alignment mark (a mark for position adjustment of the wafer) in the exposure processing at Step S16. To prevent the offset from being applied, that information is outputted to the exposure apparatus 102. In this event, when the IPFE has a margin relative to the IPFE budget and the wafer is strained, that information is additionally outputted to the exposure apparatus 102. Then, the treatment condition in the exposure apparatus 102 is corrected.

Further, since the used amount of the SOC material applied at Step S13 increases and the shape of the space pattern 551 at Step S12 is different from the ideal state, the treatment condition of the etching treatment for the SOC film 600 at Step S18 is corrected.

Further, the above feedforward control is performed and the wafer is treated under the corrected treatment conditions, and then the critical dimension of the SOC pattern 601 measured at Step S19 is analyzed. Then, when the critical dimension of the SOC pattern 601 is deviated from the target value (the target value found from the IPFE), what corrected value (offset value) is essentially appropriate is analyzed for the above-described treatment conditions, and the analysis is fed back to the next wafer (or the next lot).

(Fourth Example of Control)

As described above, the plurality of thermal treatment apparatuses 130 are provided in the first treatment system 10. In the case of performing the PEB treatment using the same kind of thermal treatment apparatuses 130, a slight difference occurs among the states of the resist films after the thermal treatment due to the difference among the thermal treatment apparatuses 130 even if the treatment conditions are the same. Then, peculiar distributions caused by the difference among the apparatuses occur also in the critical dimensions of the resist patterns to be formed. Also for the case where there is a difference among the apparatuses, the feedback control and the feedforward control are repeated to form an appropriate resist pattern.

In the case of performing the PEB treatment using, for example, four thermal treatment apparatuses 130, 25 wafers in one lot are mechanically divided into following groups A to D. The difference among the wafers is not zero even in the same group.

Group A: wafer W1, wafer W5, wafer W9, wafer W13, wafer W17, wafer W21, wafer W25
Group B: wafer W2, wafer W6, wafer W10, wafer W14, wafer W18, wafer W22
Group C: wafer W3, wafer W7, wafer W11, wafer W15, wafer W19, wafer W23
Group D: wafer W4, wafer W8, wafer W12, wafer W16, wafer W20, wafer W24

For example, when the basic in-plane distribution of the critical dimension of the resist pattern has been already obtained in the groups A to D, for example, the wafers W1, W5, W9 and the like in the group A have almost the same in-plane distribution. The critical dimension is measured at several positions where characteristics appear most conspicuously within the wafer to investigate the difference among the wafers in the group.

Then, if the average critical dimension is different for each wafer in the same group, the treatment conditions of the treatments at Step S13 and thereafter are corrected as in the above-described third example of control.

On the other hand, in the case where the average critical dimension for each wafer in the same group is constant, it is difficult to form the resist pattern 621 in an appropriate critical dimension even if the treatment conditions of the treatments on the SOC film 600 at Step S13 and thereafter are corrected. In this case, in order to form the resist pattern 621 in an appropriate critical dimension and at an appropriate position, the film thickness of the SOC film 600 is measured or estimated and the offset value for the alignment mark in the exposure processing at Step S16 is outputted to the exposure apparatus 102. Then, the treatment condition in the exposure apparatus 102 is corrected.

Further, the above-described correction of the treatment condition in the exposure apparatus 102 is performed and the wafer is processed under the corrected treatment condition, and then the critical dimension of the SOC pattern 601 measured at Step S19 is analyzed. Then, when the critical dimension of the SOC pattern 601 is deviated from the target value (the target value found from the IPFE), what corrected value (offset value) is essentially appropriate is analyzed for the above-described treatment condition, and the analysis is fed back to the next wafer (or the next lot).

The embodiment disclosed herein should be considered to be an example in all respects but not restrictive. The above embodiment may be subjected to omission, change and modification in various forms without departing from the scope and the spirit of accompanying claims.

What is claimed is:

1. A substrate treatment method of performing a plurality of predetermined treatments on a substrate to form a plurality of patterns stacked on the substrate, the substrate treatment method comprising:

a calculation step of calculating, about patterns in two layers stacked on the substrate, a mutual pattern displacement amount being a displacement amount between the patterns in the two layers, based on an end portion positional displacement of a pattern in an upper layer, an end portion positional displacement of a pattern in a lower layer, and an overlay of the patterns in the two layers; and a correction step of correcting, when the mutual pattern displacement amount exceeds a predetermined threshold, treatment conditions in the predetermined treatments to make the mutual pattern displacement amount fall within the predetermined threshold.

2. The substrate treatment method according to claim 1, wherein the correction step is feedforward control of correcting treatment conditions in subsequent treatments for the substrate under treatment.

3. The substrate treatment method according to claim 1, wherein the correction step is feedback control of correcting treatment conditions for a substrate to be treated next to the substrate under treatment.

4. The substrate treatment method according to claim 1, wherein in the calculation step, the end portion positional displacement is calculated based on variation in critical dimension of the pattern and variation in barycentric position.

5. The substrate treatment method according to claim 1, wherein the threshold of the mutual pattern displacement amount is calculated by following Expression (1)

$$IPFE = \left(OVL + \frac{\Delta L}{2} + \frac{\Delta D}{2}\right) + n\left(\sigma_{OVL} + \frac{\sigma L}{2} + \frac{\sigma D}{2}\right) \quad (1)$$

where IPFE (Interactive Pattern Fidelity Error): the mutual pattern displacement amount, OVL: a value of the overlay, $\Delta L$: a difference between a target value and an average value of the critical dimension of the pattern in the lower layer, $\Delta D$: a difference between a target value and an average value of the critical dimension of the pattern in the upper layer, n: a positive coefficient, $\sigma_{OVL}$: a standard deviation of the overlay, $\sigma_L$: a standard deviation to of the critical dimension of the pattern in the lower layer, and $\sigma_D$: a standard deviation of the critical dimension of the pattern in the upper layer.

6. The substrate treatment method according to claim 1, wherein the predetermined threshold of the mutual pattern displacement amount is set based on an allowable positional displacement amount of the pattern in the upper layer to the pattern in the lower layer.

7. A computer-readable storage medium storing a program running on a computer of a control unit configured to control a substrate treatment system so as to cause the substrate treatment system to execute a substrate treatment method of performing a plurality of predetermined treatments on a substrate to form a plurality of patterns stacked on the substrate, the substrate treatment method comprising:

a calculation step of calculating, about patterns in two layers stacked on the substrate, a mutual pattern displacement amount being a displacement amount between the patterns in the two layers, based on an end portion positional displacement of a pattern in an upper layer, an end portion positional displacement of a pattern in a lower layer, and an overlay of the patterns in the two layers; and a correction step of correcting, when the mutual pattern displacement amount exceeds a predetermined threshold, treatment conditions in the predetermined treatments to make the mutual pattern displacement amount fall within the predetermined threshold.

8. A substrate treatment system configured to form a plurality of patterns stacked on a substrate, the substrate treatment system comprising:
- a plurality of treatment apparatuses configured to perform predetermined treatments on the substrate; and
- a control unit configured to set treatment conditions of the predetermined treatments,
- wherein the control unit is configured to perform, through control of the control unit:
- a calculation step of calculating, about patterns in two layers stacked on the substrate, a mutual pattern displacement amount being a displacement amount between the patterns in the two layers, based on an end portion positional displacement of a pattern in an upper layer, an end portion positional displacement of a pattern in a lower layer, and an overlay of the patterns in the two layers; and
- a correction step of correcting, when the mutual pattern displacement amount exceeds a predetermined threshold, treatment conditions in treatments on the substrate to make the mutual pattern displacement amount fall within the predetermined threshold.

* * * * *